United States Patent
Tsuyuno et al.

(10) Patent No.: US 11,961,780 B2
(45) Date of Patent: Apr. 16, 2024

(54) SEMICONDUCTOR MODULE, POWER CONVERSION DEVICE, AND MANUFACTURING METHOD OF SEMICONDUCTOR MODULE

(71) Applicant: HITACHI ASTEMO, LTD., Hitachinaka (JP)

(72) Inventors: Nobutake Tsuyuno, Tokyo (JP); Akira Matsushita, Hitachinaka (JP); Yujiro Kaneko, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 493 days.

(21) Appl. No.: 17/295,713

(22) PCT Filed: Nov. 8, 2019

(86) PCT No.: PCT/JP2019/043801
§ 371 (c)(1),
(2) Date: May 20, 2021

(87) PCT Pub. No.: WO2020/105463
PCT Pub. Date: May 28, 2020

(65) Prior Publication Data
US 2021/0391236 A1    Dec. 16, 2021

(30) Foreign Application Priority Data
Nov. 22, 2018 (JP) .................. 2018-219304

(51) Int. Cl.
*H05K 7/20* (2006.01)
*H01L 21/48* (2006.01)
(Continued)

(52) U.S. Cl.
CPC ...... *H01L 23/3677* (2013.01); *H01L 21/4882* (2013.01); *H01L 23/3735* (2013.01); *H05K 7/209* (2013.01)

(58) Field of Classification Search
CPC ............ H01L 23/3677; H01L 21/4882; H01L 23/3735; H01L 23/051; H01L 2224/40139;
(Continued)

(56) References Cited

U.S. PATENT DOCUMENTS

2016/0358838 A1* 12/2016 Basler .................... H01L 23/24
2017/0187300 A1   6/2017 Shimazu et al.
2020/0388556 A1  12/2020 Tsuyuno

FOREIGN PATENT DOCUMENTS

JP    2013-258334 A    12/2013
JP    2015-133402 A     7/2015
(Continued)

OTHER PUBLICATIONS

International Search Report with English translation and Written Opinion issued in corresponding application No. PCT/JP2019/043801 dated Feb. 25, 2020.

*Primary Examiner* — Mohammad M Choudhry
(74) *Attorney, Agent, or Firm* — Foley & Lardner LLP

(57) ABSTRACT

A semiconductor module includes a semiconductor device that includes first and second fin bases having first and second connecting portions and a resin for sealing the outer peripheral side surfaces of first to fourth conductors, and a flow path forming body connected to the first and second connecting portions of the first and second fin bases. A first elastically deformed portion, which is elastically deformed, is provided such that a distance in a thickness direction between the outer peripheral ends of the first and second connecting portions becomes smaller than a distance in a thickness direction between intermediate portions of the first and second connecting portions. The resin is filled between the first and second connecting portions of the first and second fin bases are filled with the resin therebetween.

10 Claims, 19 Drawing Sheets

(51) Int. Cl.
*H01L 23/367* (2006.01)
*H01L 23/373* (2006.01)

(58) Field of Classification Search
CPC .......... H01L 2924/19107; H01L 21/56; H01L 23/4334; H01L 23/49524; H01L 23/49531; H01L 23/49562; H01L 23/49575; H01L 25/072; H01L 25/50; H01L 23/473; H01L 25/18; H05K 7/209; H02M 1/008; H02M 7/003; H02M 7/5387
See application file for complete search history.

(56) References Cited

FOREIGN PATENT DOCUMENTS

| | | |
|---|---|---|
| JP | 2016-039224 A | 3/2016 |
| WO | WO-2019/107077 A1 | 6/2019 |

\* cited by examiner (a)

(b)

(c)

(a)

(b)

SEMICONDUCTOR MODULE, POWER CONVERSION DEVICE, AND MANUFACTURING METHOD OF SEMICONDUCTOR MODULE

TECHNICAL FIELD

The present invention relates to a semiconductor module, a power conversion device, and a manufacturing method of the semiconductor module.

BACKGROUND ART

A semiconductor module containing a power semiconductor element that performs a switching operation has high conversion efficiency, and is widely used for consumer use, in-vehicle use, railway use, substation equipment, and the like. Since the power semiconductor element generates heat when energized, high heat dissipation is required for the semiconductor module. In particular, for in-vehicle applications, a highly efficient cooling system using a liquid refrigerant such as water for cooling the semiconductor module is adopted in order to reduce the size and weight.

An example of the structure and manufacturing method of such a semiconductor module is illustrated below.

A pair of upper and lower cases that sandwich the power module having a power semiconductor element therebetween and have a U-shaped cross section in which the peripheral wall portions are bent substantially vertically are arranged so that the side end faces of the peripheral wall portions of each case face each other. The pair of upper and lower cases are pressurized from the outside, and the peripheral wall portions of the cases are deformed so that the distance between them becomes smaller so that the side end faces of the pair of upper and lower cases come into contact with each other. In this state, the contact portions on the side end faces are bonded by welding or the like. In such a process, the power module is fixed in the case. (See, for example, PTL 1).

CITATION LIST

Patent Literature

PTL 1: JP 2016-39224 A

SUMMARY OF INVENTION

Technical Problem

The semiconductor module of PTL 1 requires a procedure of crimping the power module to the case and then a procedure of welding the bonding surface of the case, and the productivity is low. Further, PTL 1 does not describe a semiconductor module capable of cooling with a refrigerant.

Solution to Problem

A semiconductor module according to one aspect of the invention includes: a semiconductor device, which includes a semiconductor element, a pair of conductors that is arranged so as to sandwich the semiconductor element and face each other in a thickness direction, and connected to the semiconductor element, respectively, a first heat dissipation member that is arranged on a surface of a side opposite to the semiconductor element of one conductor of the pair of conductors via an insulating member, and includes a first connecting portion extending outward from an outer peripheral side surface of the one conductor, a second heat dissipation member that is arranged on a surface of a side opposite to the semiconductor element of the other conductor of the pair of conductors via an insulating member, and includes a second connecting portion extending outward from an outer peripheral side surface of the other conductor, and a resin for sealing the outer peripheral side surfaces of the pair of conductors; and a flow path forming body that is connected to the first connecting portion of the first heat dissipation member and the second connecting portion of the second heat dissipation member of the semiconductor device. A first elastically deformed portion which is elastically deformed is provided such that a distance in a thickness direction between an outer peripheral end of the first connecting portion of the first heat dissipation member and an outer peripheral end of the second connecting portion of the second heat dissipation member becomes smaller than a distance in a thickness direction between an intermediate portion of the first connecting portion of the first heat dissipation member and an intermediate portion of the second connecting portion of the second heat dissipation member. The resin is filled between first connecting portion of the first heat dissipation member and the second connecting portion of the second heat dissipation member.

Advantageous Effects of Invention

According to the invention, the productivity of a semiconductor module having a flow path forming body can be improved.

DESCRIPTION OF EMBODIMENTS

First Embodiment

Figure 1:
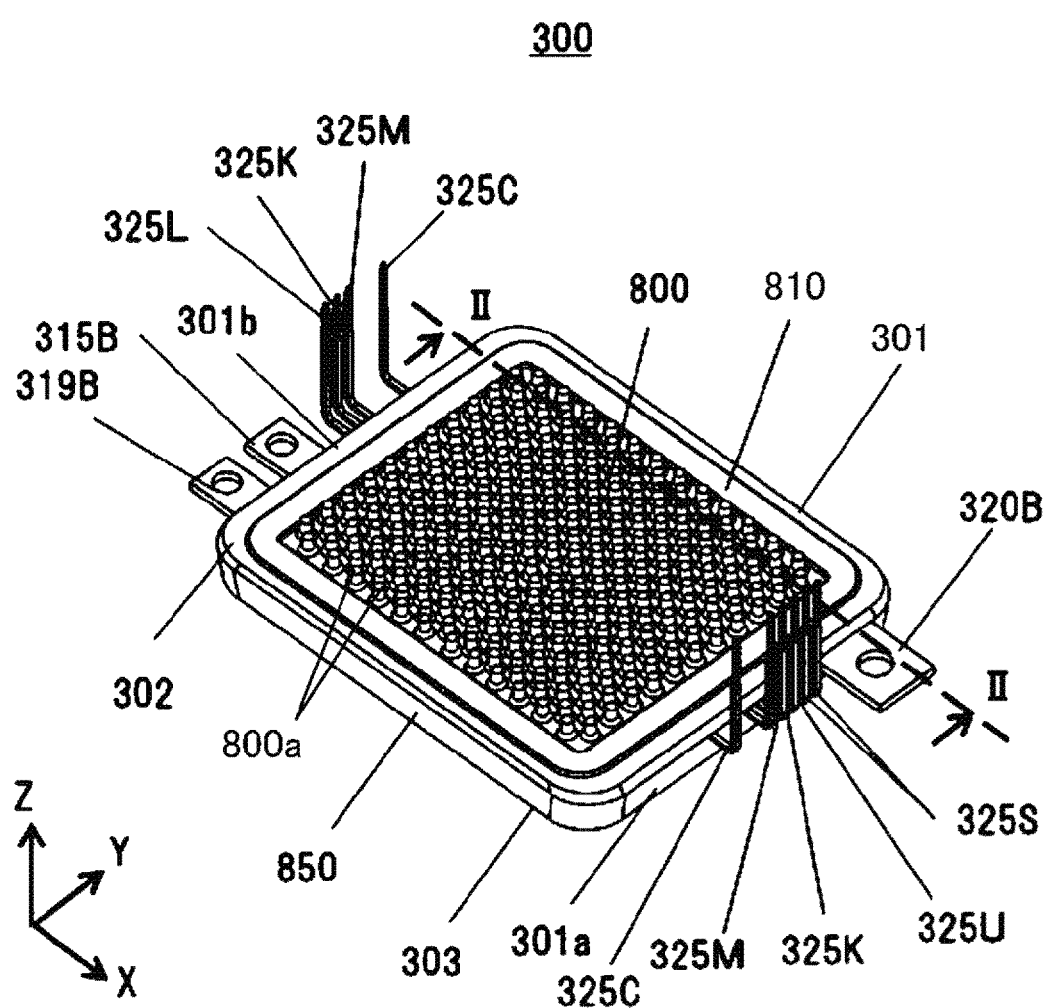
FIG. 1 is an external perspective view of an embodiment of a semiconductor device constituting a semiconductor module of the invention.

Hereinafter, embodiments of the invention will be described with reference to the drawings. The following description and drawings are exemplifications for describing the invention, and are omitted and simplified as appropriate for clarification of the description. The invention can be implemented in other various forms. Unless otherwise limited, each component may be singular or plural.

The position, size, shape, range, and the like of each component illustrated in the drawings may not necessarily represent the actual position, size, shape, range, and the like, in order to facilitate understanding of the invention. For this reason, the invention is not necessarily limited to the position, size, shape, range, and the like disclosed in the drawings.

FIG. 1 is an external perspective view of an embodiment of a semiconductor device constituting the semiconductor module of the invention.

In the following description, the X direction, the Y direction, and the Z direction are as illustrated in the drawings.

FIG. 1 is an external perspective view of an embodiment of the semiconductor device according to the invention.

The semiconductor device 300 includes a device body 301 which is a resin package in which internal electronic components are sealed with a resin 850, a fin base 800, a plurality of power terminals for inputting/outputting a large current, and a plurality of signal terminals for inputting/outputting signals. The device body 301 has a substantially rectangular parallelepiped shape, in other words, a substantially rectangular shape when a main surface 302 having the largest area is in a plan view from the vertical direction. The plurality of power terminals and the plurality of signal terminals project from one side 301a in the length direction (X direction) of the device body 301 and the other side 301b facing the one side. The fin base 800 having a large number of fins 800a is provided on each of the main surface 302 of the device body 301 and a back surface 303 which is the facing surface of the main surface 302. On the outer peripheral edge of each fin base 800, the connecting portion 810 with a flow path forming body 600 (see FIG. 10) forming a space for arranging the refrigerant is provided.

Power terminals such as a positive electrode side terminal 315B and a negative electrode side terminal 319B project from the other side 301b of the device body 301. An AC side terminal 320B projects as a power terminal from one side 301a of the device body 301.

Signal terminals such as a lower-arm gate signal terminal 325L, a mirror emitter signal terminal 325M, a Kelvin emitter signal terminal 325K, and a collector sense signal terminal 325C project from the other side 301b of the device body 301. Signal terminals such as an upper-arm gate signal terminal 325U, a temperature sense signal terminal 325S, the mirror emitter signal terminal 325M, the Kelvin emitter signal terminal 325K, and the collector sense signal terminal 325C project from one side 301a of the device body 301. When these signal terminals are comprehensively described, a signal terminal 325 is used.

As illustrated in FIG. 1, the positive electrode side terminal 315B and the negative electrode side terminal 319B, which are power terminals, and the AC side terminal 320B are provided so as to face each other on the other side 301b and one side 301a of the device body 301.

The plurality of power terminals and the plurality of signal terminals project in the longitudinal direction (+X direction and −X direction), and the tip is vertically bent and extended in the height direction (+Z direction). By directing the plurality of signal terminals in the same +Z direction, it becomes easy to connect to the control circuit and driver circuit. Further, since the control terminal is divided into two sides, one side 301a and the other side 301b of the device body 301 and projects, the creepage distance and the space distance between the terminals are secured.

The positive electrode side terminal 315B and the negative electrode side terminal 319B are arranged adjacent to each other on the other side 301b side of the device body 301 in the Y direction. Further, the positive electrode side terminal 315B and the negative electrode side terminal 319B are arranged so that the side surfaces, which are small areas refracted in an L shape, face each other, so that the input/output currents are brought close to each other to reduce the inductance. In addition, since the positive electrode side terminal 315B and the negative electrode side terminal 319B, which are DC terminals, are connected to the capacitor module 500 (see FIG. 12) connected to a battery, the terminals project from the same other side 301b side, so that the effect of simplifying the inverter layout is obtained. The AC side terminal 320B protrudes from the facing surface opposite to the surface on which the DC-side terminal protrudes. After connecting to a current sensor 180 (see FIG. 12), the AC side terminal 320B protrudes from the power conversion device and is connected to motor generators 192 and 194 (see FIG. 12). Therefore, there is an effect that the inverter layout can be simplified by projecting in a direction different from the DC terminal connected to the capacitor module 500.

Figure 2:
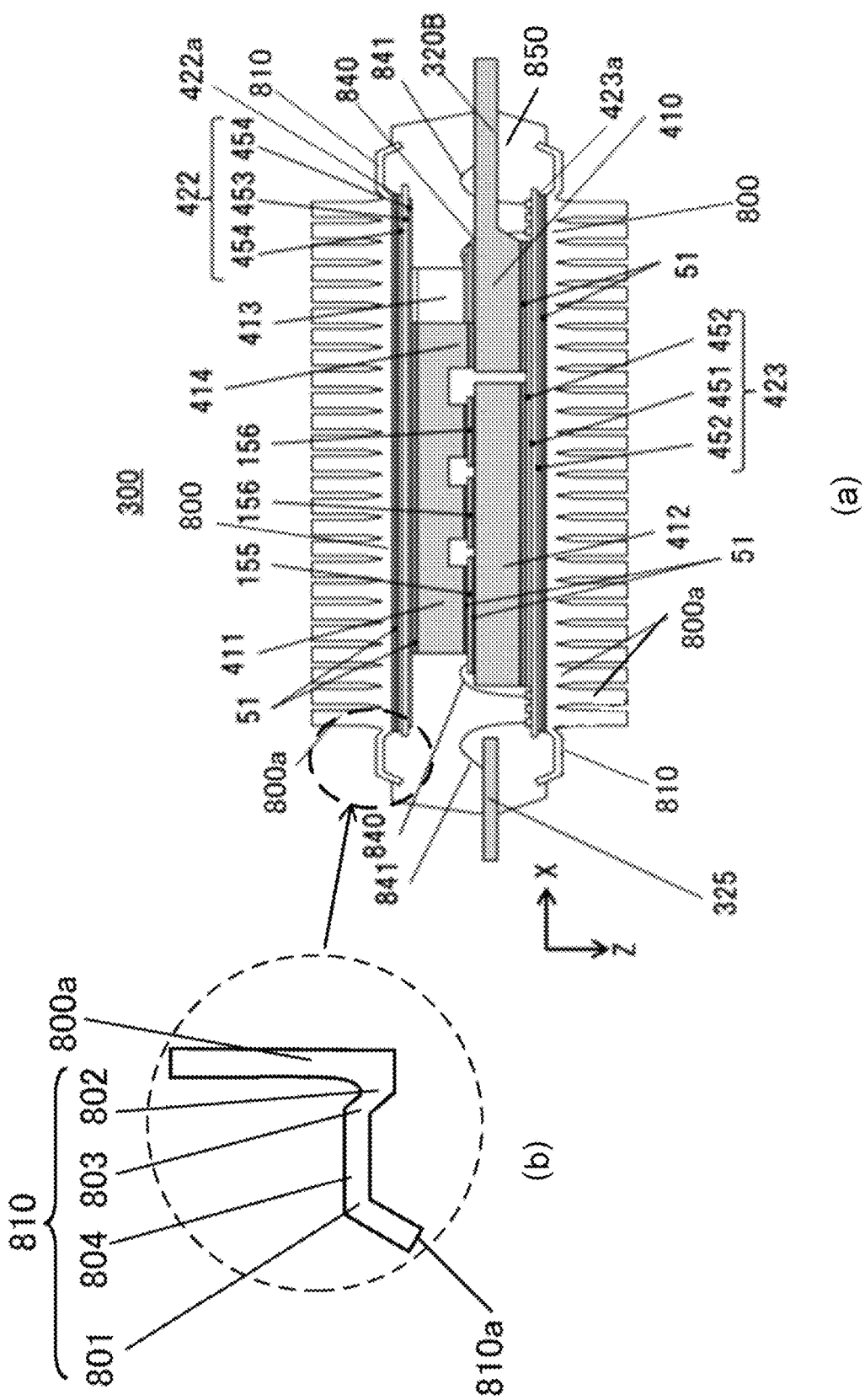
FIG. 2($a$) is a cross-sectional view taken along line II-II of the semiconductor device illustrated in FIG. 1, and FIG. 2($b$) is an enlarged view of a connecting portion 810 illustrated in FIG. 2($a$).
Figure 3:
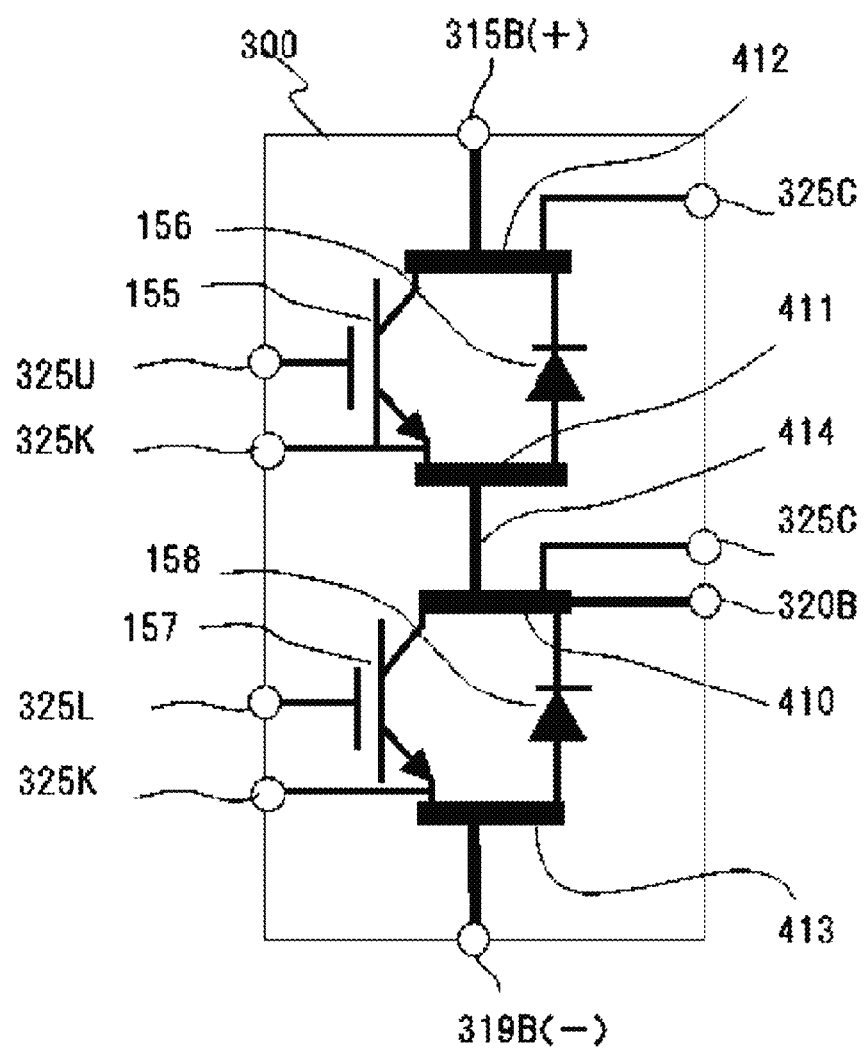
FIG. 3 is a circuit diagram illustrating an example of a circuit of the semiconductor device illustrated in FIG. 1.

FIG. 2(a) is a cross-sectional view taken along line II-II of the semiconductor device illustrated in FIG. 1, FIG. 2(b) is an enlarged view of the connecting portion 810 illustrated in FIG. 2(a), and FIG. 3 is a circuit diagram illustrating an example of the circuit of the semiconductor device illustrated in FIG. 1.

The semiconductor device 300 includes an upper arm circuit having a switching function including an active element 155 and a diode 156, and a lower arm circuit having a switching function including an active element 157 and a diode 158. The active elements 155 and 157 and the diodes 156 and 158 are called semiconductor elements. This semiconductor element is not particularly limited as long as it has a switching function, but transistors such as IGBT (Insulated Gate Bipolar Transistor) and MOSFET (Metal-Oxide-Semiconductor Field-Effect Transistor) are used as the active elements 155 and 157. As the diodes 156 and 158, SBD (Schottky Diode), FRD (Fast Recovery Diode) and the like are used. Si is often used as a material for constituting the semiconductor element, but SiC, GaN, GaO, or the like can also be used.

As illustrated in FIG. 3, the positive electrode side terminal 315B is connected to a third conductor 412. The collector electrode of the active element 155 and the cathode electrode of the diode 156 constituting the switching element of the upper arm circuit are electrically connected by the third conductor 412. The emitter electrode of the active element 155 and the anode electrode of the diode 156 are electrically connected by the second conductor 411.

The negative electrode side terminal 319B is electrically connected to a fourth conductor 413. The emitter electrode of the active element 157 and the anode electrode of the diode 158 constituting the switching element of the lower arm circuit are electrically connected by the fourth conductor 413. The collector electrode of the active element 157 and the cathode electrode of the diode 158 are electrically connected by a first conductor 410. The first conductor 410 and the second conductor 411 are electrically connected via an intermediate electrode portion 414. The AC side terminal 320B is electrically connected to the first conductor 410. The Kelvin emitter signal terminal 325K is connected to the emitter electrode of each of the upper arm circuit and the lower arm circuit. The collector sense signal terminal 325C of the upper arm circuit is electrically connected to the third conductor 412, and the collector sense signal terminal 325C of the lower arm circuit is connected to the first conductor 410.

The active elements 155 and 157 may be configured to include a plurality of active elements 155 and 157, respectively.

As illustrated in FIG. 2(a), the collector electrode of the active element 155 and the anode electrode of the diode 156 are bonded to the third conductor 412 via a metal bonding member 51 such as solder or sintered metal. The emitter electrode of the active element 155 and the cathode electrode of the diode 156 are bonded to the second conductor 411 via the metal bonding member 51 such as solder or sintered metal. The collector electrode of the active element 157 and the diode 158 (anode electrode (not illustrated in FIG. 2)) are bonded to the first conductor 410 via the metal bonding member 51 such as solder or sintered metal. The emitter electrode of the active element 157 (not illustrated in FIG. 2) and the cathode electrode of the diode 158 are bonded to the fourth conductor 413 by the metal bonding member 51 such as solder or sintered metal. The first conductor 410 is bonded to the intermediate electrode portion 414 (see also FIG. 6(a)) integrally formed with the second conductor 411 by the metal bonding member 51. As a result, the first conductor 410 and the second conductor 411 are electrically connected.

The entire lower surface of the active elements 155 and 157 is a collector electrode, the entire lower surface of the diodes 156 and 158 is an anode electrode, and the active area of the upper surface is a cathode electrode.

The first to fourth conductors 410 to 413 are formed of copper or aluminum, but other materials may be used as long as they are materials having a high electrical conductivity. A collector-side wiring board 423 is arranged on the lower surface (+Z direction) of the first conductor 410 and the third conductor 412. The collector-side wiring board 423 is bonded to the first conductor 410 and the third conductor 412 by a metal bonding member 51 such as solder or sintered metal. The collector-side wiring board 423 is configured by forming a wiring 452 made of copper or aluminum on the front and back surfaces of an insulating plate 451 made of ceramic or the like. The first conductor 410 and third conductor 412 are bonded to the wiring 452 by the metal bonding member 51. The conductors and wirings to be metal-bonded may be plated or provided with fine irregularities in order to increase the bonding strength. The electrodes of the active elements 155 and 157 each are connected to the wiring formed on the collector-side wiring board 423 by a wire 840, and are connected to the signal terminal 325 exposed to the outside of the resin 850 by a wire 841. The wires 840 and 841 may be formed of continuous wires depending on the connection layout. The connection between the electrodes of the active elements 155 and 157 and the wiring will be described later.

An emitter-side wiring board 422 is arranged on a surface of the upper side (−Z direction) of the second conductor 411 and the fourth conductor 413. The emitter-side wiring board 422 is bonded to the second conductor 411 and the fourth conductor 413 by a metal bonding member 51 such as solder or sintered metal. The emitter-side wiring board 422 is configured by forming a wiring 454 made of copper or aluminum on the front and back surfaces of an insulating plate 453 made of ceramic or the like. The second conductor 411 and the fourth conductor 413 are bonded to the wiring 454 formed on the emitter-side wiring board 422 by the metal bonding member 51.

In FIG. 2(a), the fin bases 800 are bonded to the lower surface of the collector-side wiring board 423 and the upper surface of the emitter-side wiring board 422, respectively. The collector-side wiring board 423 or the emitter-side wiring board 422 and the fin base 800 are bonded by a metal bonding member 51 such as solder or sintered metal.

The upper and lower fin bases 800 are sealed with the resin 850. The resin 850 is formed by, for example, molding such as a transfer mold.

The fin base 800 having a large number of fins 800a is a heat dissipation member, and has the connecting portion 810 extending outward from an outer peripheral end 422a of the emitter-side wiring board 422 or an outer peripheral end 423a of the collector-side wiring board 423. The connecting portion 810 has low rigidity formed to a thickness substantially equal to or thinner than the thickness (length in the Z direction) from the bottom surface of the fin base 800 to the base of the fin 800a.

(Fin Base 800)

As illustrated in FIG. 2(b), the connecting portion 810 has a flat intermediate portion 804 approximately parallel to the XY plane. Further, the connecting portion 810 has first to third elastically deformed portions 801 to 803. The first elastically deformed portion 801 is formed on an outer peripheral end 810a side of the connecting portion 810. The second elastically deformed portion 802 is formed in a region corresponding to the outer peripheral end 422a of the emitter-side wiring board 422 or the outer peripheral end 423a of the collector-side wiring board 423, which is the root side of the connecting portion 810. The third elastically deformed portion 803 is formed on the side opposite to the first elastically deformed portion 801 side in the intermediate portion 804. The distance in the thickness direction (Z direction) between the outer peripheral ends 810a of the upper and lower fin bases 800 is smaller than the distance in the thickness direction (Z direction) between the intermediate portions 804 of the upper and lower fin bases 800.

The resin 850 that covers the outer peripheral side surfaces of the first to fourth conductors 410 to 413 is filled between the connecting portions 810 of the upper and lower fin bases 800. The first to third elastically deformed portions 801 to 803 of the connecting portion 810 are formed at the time of the molding when a pre-sealing semiconductor device configuration 304 (see FIG. 5(a)) is installed in a mold 852 (see FIG. 8(a)), and a resin material 850S (see FIG. 8(a)) is injected into the mold 852. This has the effect of reducing the variation in the spacing between the intermediate portions 804 of the connecting portions 810 in the upper and lower fin bases 800. This will be described later.

The shape of the connecting portion 810 protruding from the left and right of the fin base 800 in FIG. 2(b) is the shape after being sealed with resin. The connecting portion 810 of the fin base 800 before resin sealing has the shape of a thin flat plate extending in the X direction. Then, as will be described later, when loaded into the mold for molding, as illustrated in FIGS. 8(a) and 8(b), the connecting portion 810 of the pair of upper and lower fin bases 800 is pressed between the upper and lower molds 852a and 852b and elastically deformed, and becomes the shape illustrated in FIG. 2(b) in the molding process for filling resin.

(Manufacturing Method)

Figure 4:
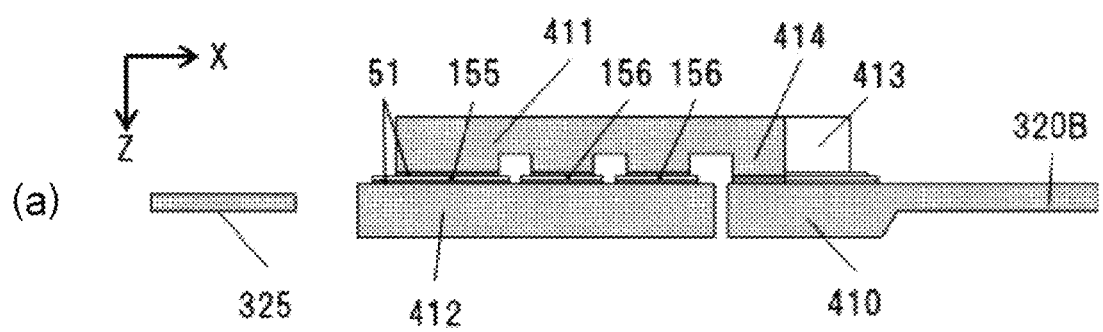
FIGS. 4($a$) to 4($c$) are cross-sectional views in each process for explaining a manufacturing method of the semiconductor device illustrated in FIG. 1.
Figure 4:
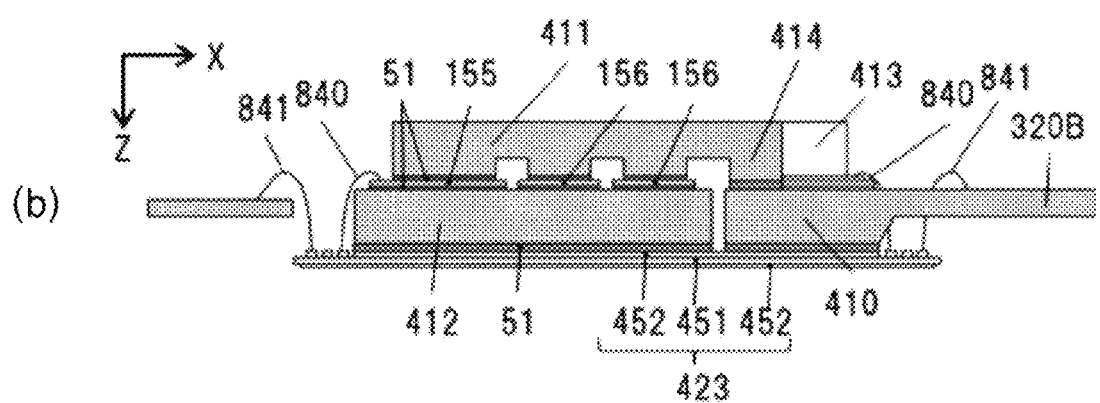
Figure 4:
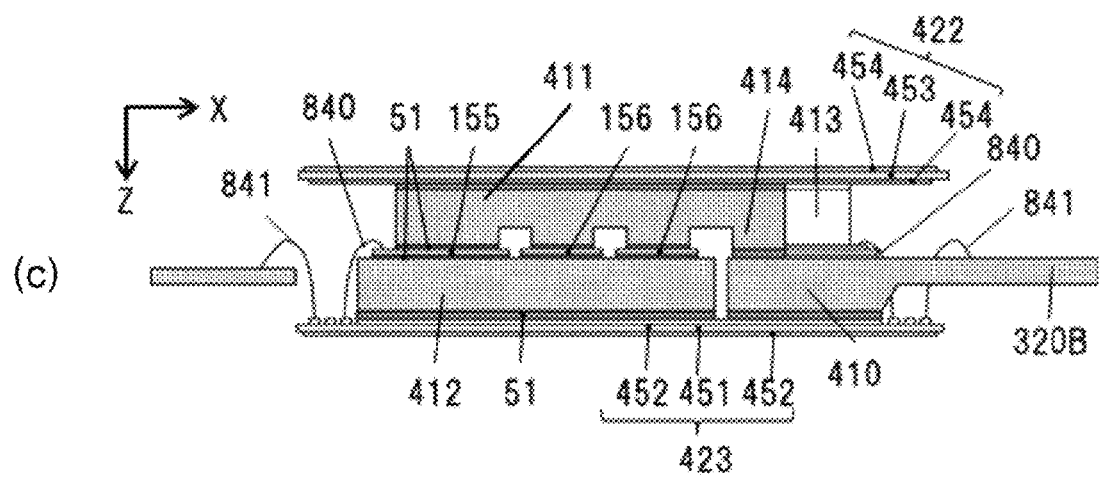
Figure 5:
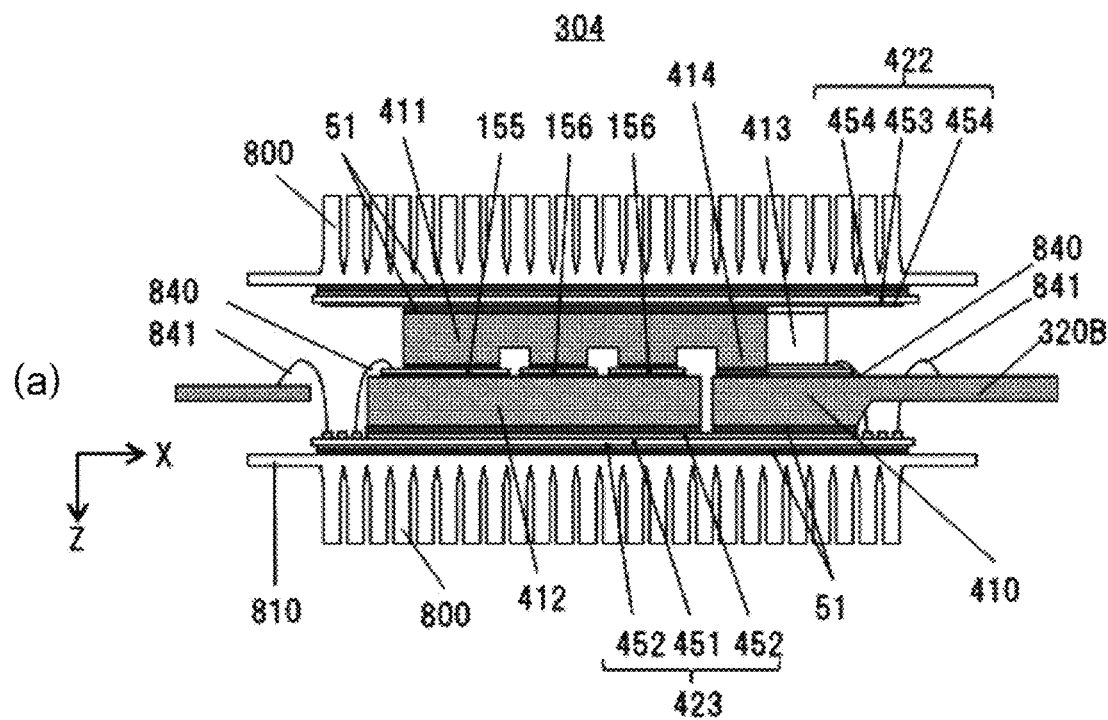
FIGS. 5($a$) to 5($b$) are cross-sectional views in each process for explaining the manufacturing method of the semiconductor device following FIGS. 4($a$) to 4($c$).
Figure 5:
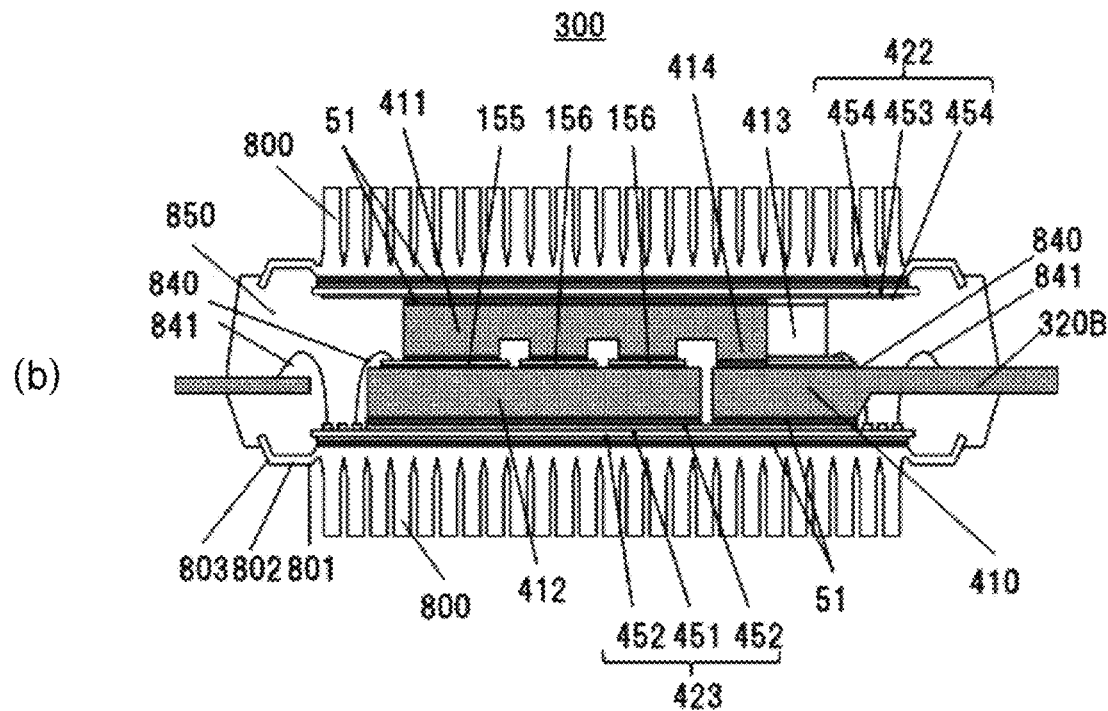
Figure 6:
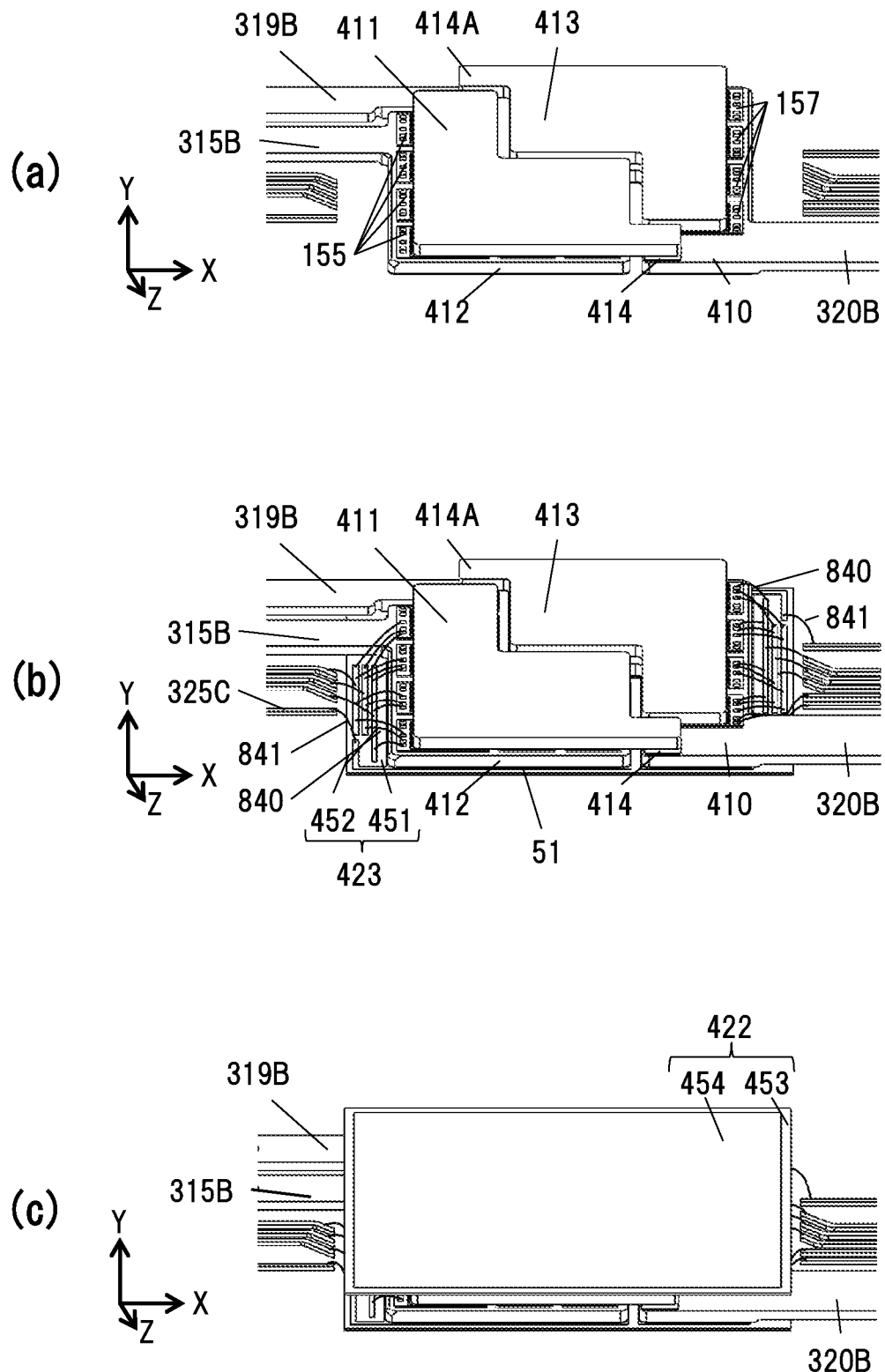
FIGS. 6($a$) to 6($c$) are perspective views of the processes corresponding to FIGS. 4($a$) to 4($c$), respectively.
Figure 7:
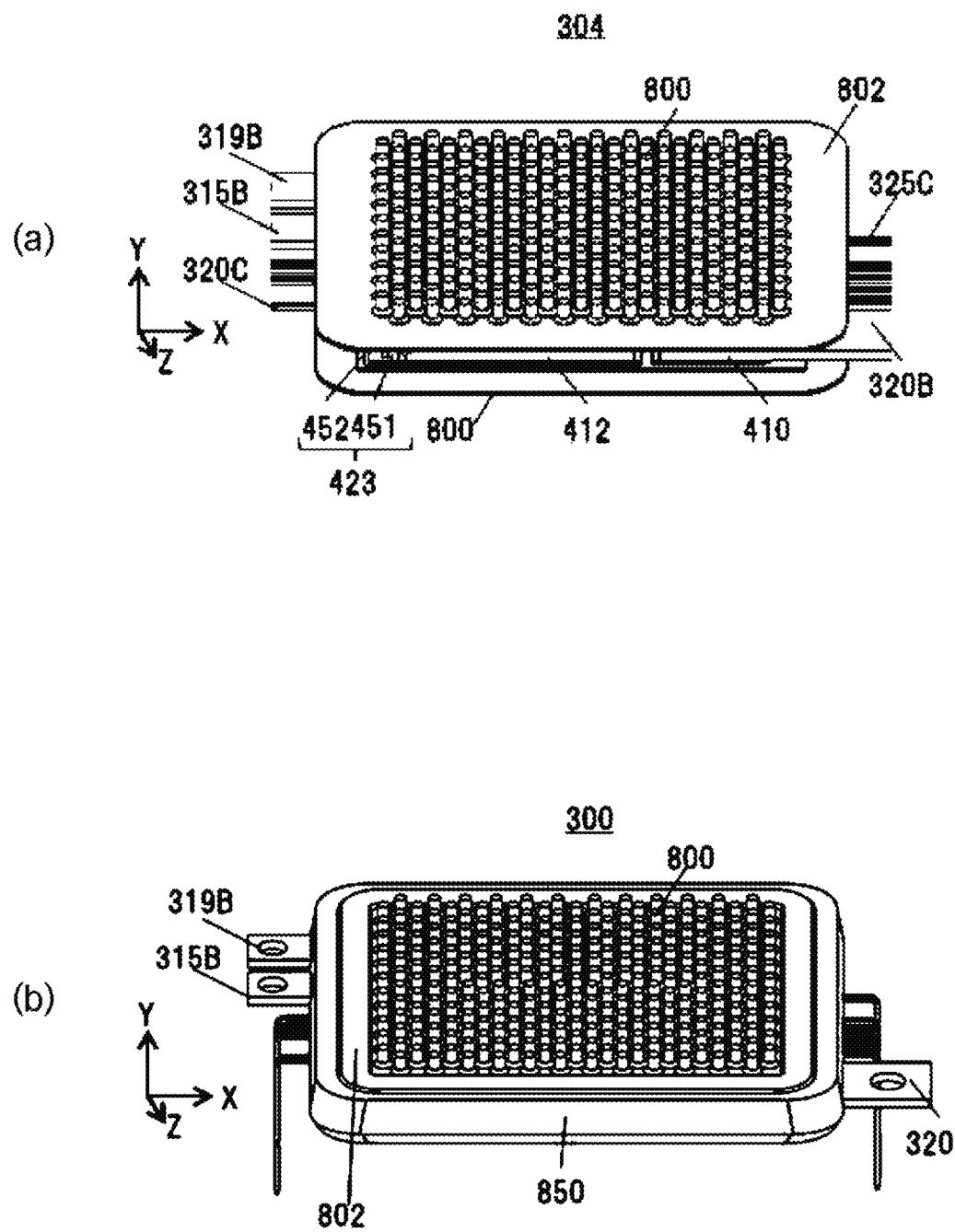
FIGS. 7($a$) and 7($b$) are perspective views of the processes corresponding to FIGS. 5($a$) and 5($b$), respectively.

FIGS. 4(a) to 4(c) are cross-sectional views in each step for explaining the manufacturing method of the semiconductor device illustrated in FIG. 1, and FIGS. 5(a) to 5 (b) are cross-sectional views in each process for explaining the manufacturing method of the semiconductor device subsequent to FIGS. 4 (a) to 4 (c). FIGS. 6 (a) to 6(c) are perspective views of the processes corresponding to FIGS. 4(a) to 4 (c), respectively, and FIGS. 7(a) to 7(b) illustrate perspective views of the processes corresponding to FIGS. 5(a) to 5 (b), respectively.

With reference to FIGS. 4(a) to 4(c), 5(a) to 5(b), 6(a) to 6(c) and 7(a) to 7 (b), the manufacturing method of the semiconductor device 300 illustrated in FIG. 1 will be described.

As illustrated in FIGS. 4 (a) and 6(a), the collector electrode of the active element 155 and the cathode electrode of the diode 156 are bonded to the third conductor 412 by the metal bonding member 51. Similarly, the collector electrode of the active element 157 and the cathode electrode of the diode 158 are bonded to the first conductor 410 by the metal bonding member 51.

Further, the emitter electrode of the active element 155 and the anode electrode of the diode 156 are bonded to the second conductor 411 by the metal bonding member 51. Similarly, the emitter electrode of the active element 157 and the anode electrode of the diode 158 are bonded to the fourth conductor 413 by the metal bonding member 51.

In FIGS. 4(a) to 4(c), 5(a), and 5(b), the AC side terminal 320B is integrally formed in the first conductor 410 in order to increase productivity, but the AC side terminal 320B may be formed separately from the first conductor 410.

Next, as illustrated in FIGS. 4(b) and 6(b), the collector side wiring board 423 is bonded to the lower surfaces of the first conductor 410 and the third conductor 412 by the metal bonding member 51, and the electrodes of the active elements 155 and 157 each are electrically connected to the wiring 452 of the collector-side wiring board 423 by the wire 840. Further, each wiring 452 and all the signal terminals illustrated in FIG. 1 are connected by the wire 841.

Subsequent processes are illustrated in FIGS. 4(c) and 6(c). As illustrated in these drawings, the wiring 454 on the lower side (Z direction side) of the emitter-side wiring board 422 is bonded to the upper surfaces of the second conductor 411 and the fourth conductor 413 by the metal bonding member 51.

In this embodiment, the first conductor 410 and the third conductor 412, which are collector-side conductors, and the collector-side wiring board 423 are separated from each other. Although the thickness of the wiring 452 of the collector-side wiring board 423 is thin, the thickness of the first conductor 410 and the third conductor 412 is thick, so that heat can be diffused in the plane direction. By reducing the thickness of the wiring 452 of the collector-side wiring board 423, the collector-side wiring board 423 can be made cheaper, and since the thickness of the wiring 452 is thin, the wiring pattern can be miniaturized, and the area of the collector-side wiring board 423 is reduced, and miniaturization becomes possible.

The same applies to the emitter side, and the second conductor 411 and the fourth conductor 413, which are the emitter-side conductors, and the emitter-side wiring board 422 are separated from each other, whereby heat can be diffused through the second conductor 411 and the fourth conductor 413 in the plane direction, and the emitter-side wiring board 422 can be made inexpensive and miniaturized.

The fin bases 800 are provided on the front and back surfaces of the intermediate obtained in the process of FIG. 4(c). That is, as illustrated in FIGS. 5(a) and 7(a), the fin base 800 is bonded to the lower surface of the collector-side wiring board 423 and the upper surface of the emitter-side wiring board 422 by the metal bonding member 51, respectively. The fin base 800 is made of, for example, aluminum. When the wiring 452 of the collector-side wiring board 423 and the wiring 454 of the emitter-side wiring board 422 are formed of copper, the fin base 800 is warped due to the difference in thermal expansion between aluminum and copper. However, in this embodiment, the fin base 800 is bonded by the metal bonding member 51 to each of the collector-side wiring board 423 bonded to the first conductor 410 and the third conductor 412, and the emitter-side wiring board 422 bonded to the second conductor 411 and the fourth conductor 413, respectively. Therefore, it is possible to reduce the warp when bonding the fin base 800. Therefore, the bonding process of the fin base 800 can be a low pressure or no pressure bonding process instead of the pressure bonding process. As a result, the cost of the production equipment can be reduced.

The bonding surface of the fin base 800 may be nickel-plated.

Further, the collector-side wiring board 423 and the emitter-side wiring board 422 may be bonded to the fin base 800 in advance by a metal bonding member 51 or the like.

The semiconductor device 300 before being sealed with the resin 850 illustrated in FIGS. 5(a) and 7(a) is referred to as a pre-sealing semiconductor device configuration 304.

The pre-sealing semiconductor device configuration 304 obtained in the process of FIGS. 5(a) and 7(a) is resin-sealed. That is, as illustrated in FIGS. 5(b) and 7(b), the pre-sealing semiconductor device configuration 304 provided between the pair of upper and lower fin bases 800 is sealed with the resin 850. Sealing with the resin 850 is performed by transfer mold molding. Before the resin molding, the pre-sealing semiconductor device configuration 304 may be coated with a resin thin film.

(Molding)

FIG. 8(a) is a cross-sectional view of the process of installing the pre-sealing semiconductor device configuration in a mold and performing resin molding, and FIG. 8(b) is an enlarged view of a region VIIIb of FIG. 8(a), and FIG. 8(c) is a side view illustrating the shape of the connecting portion 810 of the fin base 800 before the pre-sealing semiconductor device configuration is resin-molded.

Figure 8:
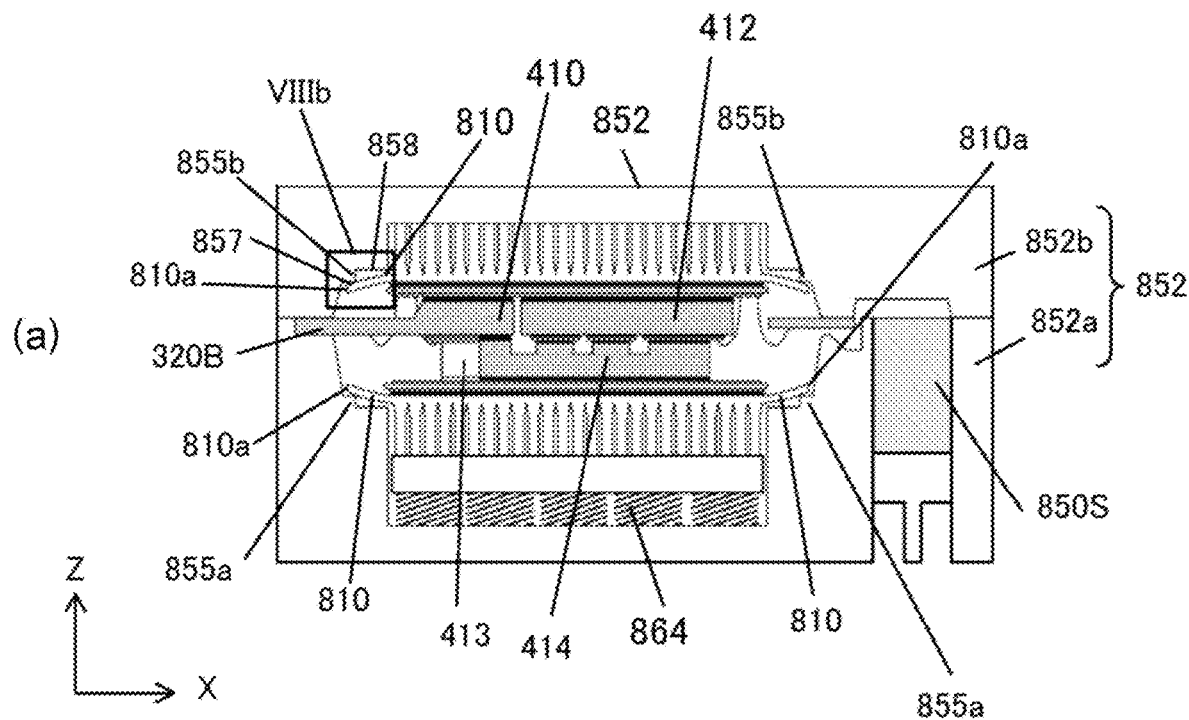
FIG. 8($a$) is a cross-sectional view of a process of installing a pre-sealing semiconductor device configuration in a mold and performing resin molding, and FIG. 8($b$) is an enlarged view of a region VIIIb of FIG. 8($a$), and FIG. 8($c$) is a side view illustrating the shape of the connecting portion 810 of a fin base 800 before the pre-sealing semiconductor device configuration is resin-molded.
Figure 8:
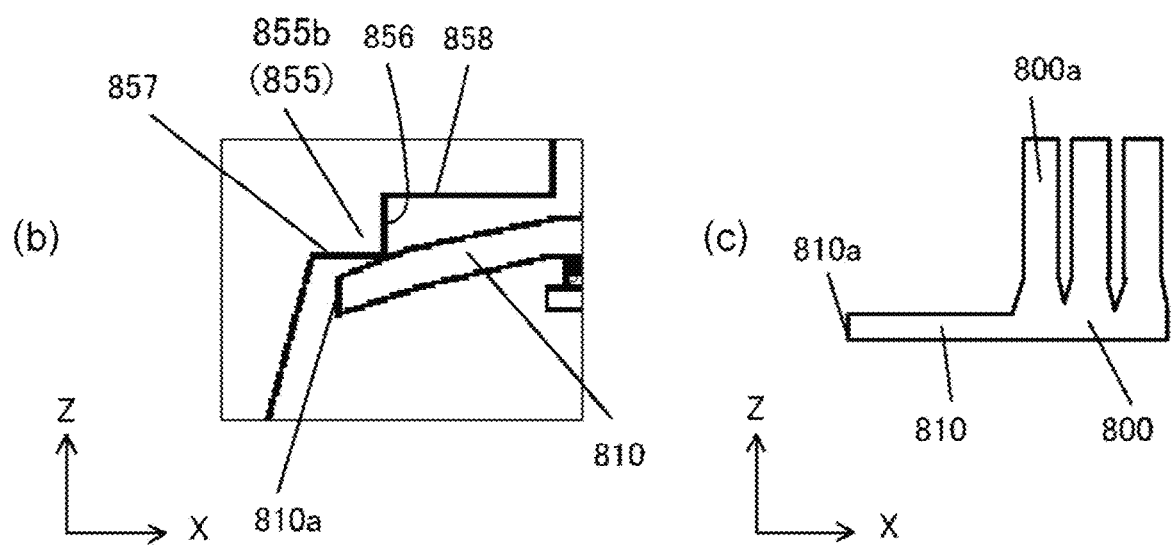

With reference to FIG. 8(c), the connecting portion 810 of the fin base 800 before the resin molding has the shape of a thin flat plate extending parallel to the X direction. Then, referring to FIG. 8(b), when the pre-sealing semiconductor device configuration is loaded in the mold for resin molding, the pair of upper and lower connecting portions 810 are pressed in the Z direction at stepped portions 855 of the upper and lower molds 852a and 852b, and deformed as illustrated in FIG. 8 (b). The details will be described below.

As illustrated in FIG. 8(a), the pre-sealing semiconductor device configuration 304 illustrated in FIG. 5(a) is installed in the cavity of the mold 852 composed of a lower mold 852a and an upper mold 852b. As described with reference to FIG. 8(c), each fin base 800 is formed with a low-rigidity connecting portion 810. When the pre-sealing semiconductor device configuration 304 is installed in the upper and lower molds 852a and 852b, the outer peripheral end 810a of the connecting portion 810 abuts on a first surface 857 of the stepped portion 855b of the upper mold 852b as illustrated in FIG. 8(b). Similarly, although not illustrated in FIG. 8(b), the outer peripheral end 810a abuts on the first surface 857 of the stepped portion 855a of the lower mold 852a. The reason for this is illustrated below.

Figure 19:
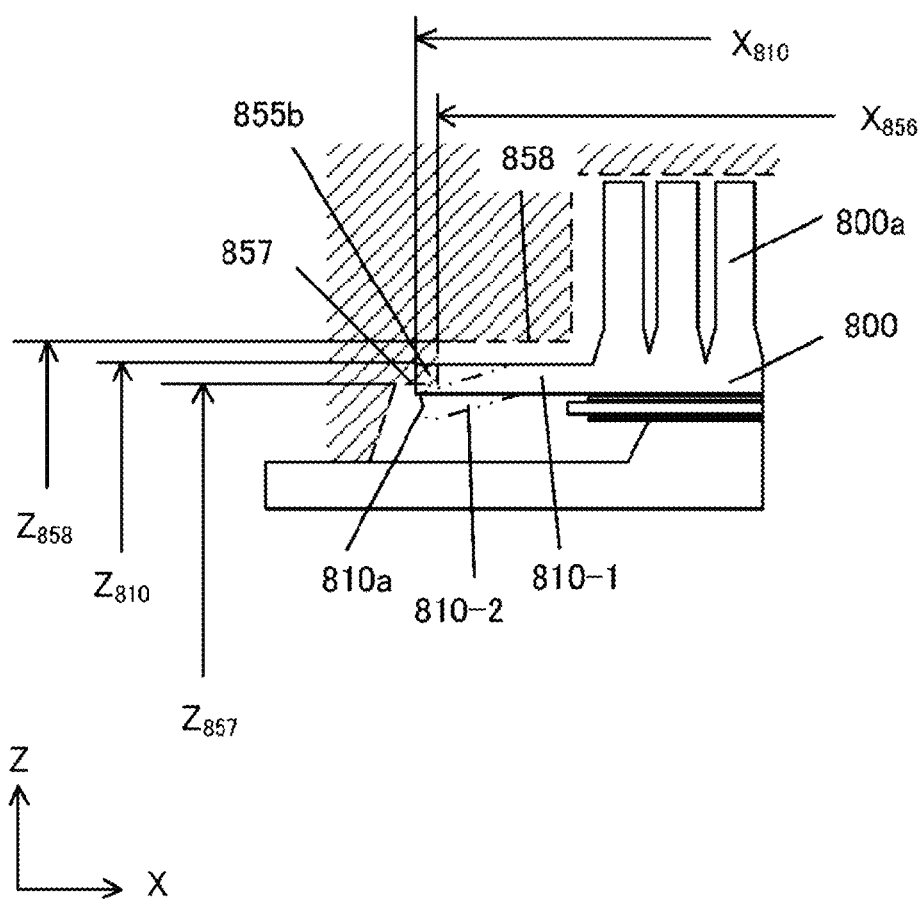
FIG. 19 is a schematic view for explaining deformation of the connecting portion of the fin base by a mold in a state where the pre-sealing semiconductor device configuration is installed in the mold.

FIG. 19 is a schematic view for explaining deformation of the connecting portion of the fin base by a mold in a state where the pre-sealing semiconductor device configuration is installed in the mold. FIG. 19 is also referred for description.

Reference numeral 810-1 illustrated by a solid line in FIG. 19 indicates the shape of the connecting portion 810 extending parallel to the X direction before deformation before the resin molding.

The lower mold 852a and the upper mold 852b are formed with a stepped portion 855a or a stepped portion 855b, respectively. The structure of the stepped portion 855a of the lower mold 852a and the stepped portion 855b of the upper mold 852b are the same, and the stepped portion 855a and the stepped portion 855b will be described below as the stepped portion 855 as a representative. Further, the stepped portion 855 has the first surface 857 and a second surface 858 extending in the X direction and facing the −Z direction.

For the length in the X direction, the length between the outer peripheral ends 810a of the connecting portion 810, that is, the dimension $X_{810}$ illustrated in FIG. 19, is larger than the length between the vertical side surfaces 856 of the stepped portion 855, that is, the dimension $X_{856}$ illustrated in FIG. 19. The distance in the thickness direction (Z direction) between the first surface 857 of the stepped portion 855b of the upper mold 852b and the first surface 857 of the stepped portion 855a of the lower mold 852a, that is, the dimension $Z_{857}$ illustrated in FIG. 19 is set to be smaller than the distance between the connecting portions 810 of the upper and lower fin bases 800 of the pre-sealing semiconductor device configuration 304 in the thickness direction (Z direction), that is, the dimension $Z_{810}$ illustrated in FIG. 19. Further, the distance between a second surface 858 of the stepped portion 855b of the upper mold 852b and the second surface 858 of the stepped portion 855a of the lower mold 852a in the thickness direction (Z direction), that is, the dimension $Z_{858}$ illustrated in FIG. 19 is set to be larger than the distance $Z_{810}$ between the connecting portions 810 of the upper and lower fin bases 800 of the pre-sealing semiconductor device configuration 304.

The first surface 857 and the second surface 858 of the stepped portions 855a and 855b of the mold 852 are formed on a flat surface substantially parallel to the XY surface.

As described above, the dimensions of the connecting portion 810 of the fin base 800, and the first surface 857 and the second surface 858 of the mold stepped portions 855a and 855b are set as described above. Therefore, when the pre-sealing semiconductor device configuration 304 is installed in the cavity of the mold 852 and the mold 852 is closed, the portions near the outer peripheral ends 810a of the connecting portions 810 of the upper and lower fin bases 800 each correspond to corners at which the first surface 857 of the stepped portion 855b or the stepped portion 855a and a vertical side surface 856 intersect as illustrated in FIGS. 8(a) and 8(b), and a connecting portion 810-1 before deformation indicated by a solid line in FIG. 19 is bent like a connecting portion 810-2 after deformation indicated by a two-dot chain line 810-2.

Figure 9:
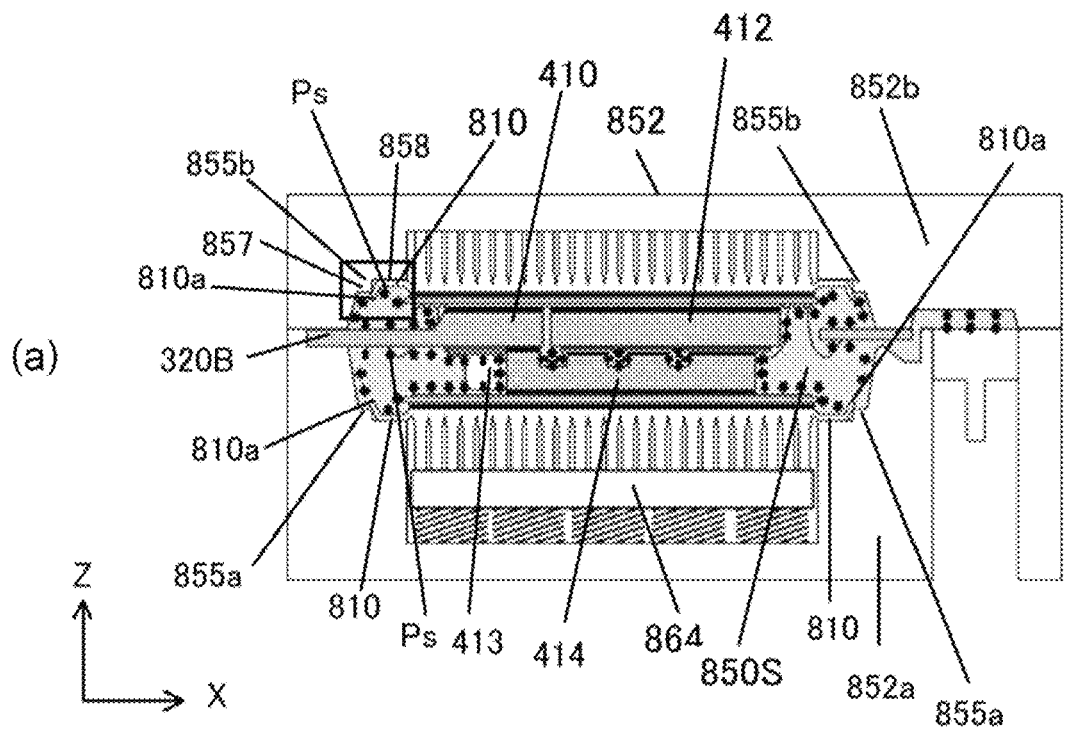
FIG. 9($a$) is a diagram for explaining the action of the resin in a state where the resin is injected into the mold illustrated in FIG. 8($a$), and FIG. 9($b$) is an enlarged view of a region XIb of FIG. 9($a$).
Figure 9:
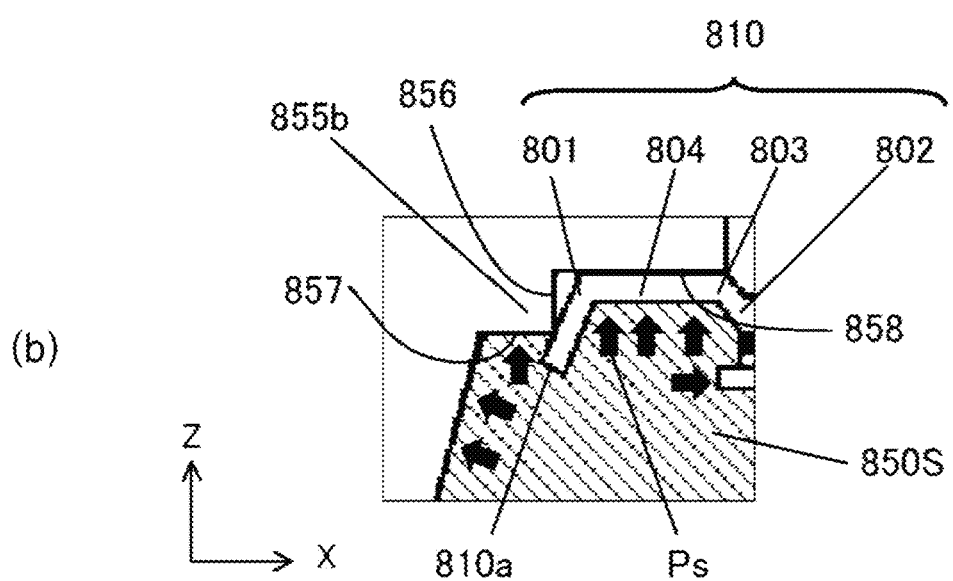

FIG. 9(a) is a diagram for explaining the action of the resin in a state where the resin is injected into the mold illustrated in FIG. 8(a), and FIG. 9(b) is an enlarged view of a region XIb of FIG. 9 (a).

The resin material 850S is injected into the mold 852 in the state illustrated in FIGS. 8(a) and 8(b). The resin material 850S flows into the cavity of the mold 852 and is filled between the connecting portions 810 of the upper and lower fin bases 800 to seal the outer peripheral side surfaces of the first to fourth conductors 410 to 413. As described above, in this state, the connecting portions 810 of the upper and lower fin bases 800 are pressed against the first surfaces 857 of the stepped portions 855b and 855a, respectively. Therefore, the resin material 850S injected between the upper and lower fin bases 800 is suppressed from leaking at the contact portion between the connecting portion 810 of the upper and lower fin bases 800 and the first surface 857 of the stepped portion 855b or the stepped portion 855a, and no leakage to the second surface 858 side of the step 855b or step 855a occurs.

When the pre-sealing semiconductor device configuration 304 to which the pair of upper and lower fin bases 800 are bonded is strongly clamped by the mold 852, excessive stress is generated in the active elements 155 and 157 and the like. However, since the fin base 800 is provided with the connecting portion 810 and the fin base 800 is configured to bend with a small load at the low-rigidity connecting portion 810, the stress acting on the active elements 155 and 157, etc. can be relaxed.

Further, as illustrated in FIG. 8(a), a spring mechanism 864 is provided in the mold 852. The spring mechanism 864 has a function of preventing peeling that acts on the active elements 155 and 157, etc. via the first to fourth conductors 410 to 413 and the collector-side/emitter-side wiring boards 422 and 423. Peeling is the following phenomenon. That is, a hydrostatic pressure Ps expanding the space between the fin bases 800 acts on the upper and lower fin bases 800 by the resin material 850S that is filled around the pre-sealing semiconductor device configuration 304 installed in the cavity of the mold 852 (see FIGS. 9(a) and 9(b)). Therefore, a peeling force acts on the active elements 155 and 157, etc. via the first to fourth conductors 410 to 413 and the collector-side/emitter-side wiring boards 423 and 422. By making the pressing force on the pre-sealing semiconductor device configuration 304 by the spring mechanism 864 larger than the pressing force on the pre-sealing semiconductor device configuration 304 generated by the mold clamping forces of the upper and lower molds 852a and 852b, the peeling force acting on the active elements 155 and 157, etc. can be canceled.

The active elements 155 and 157, etc. are strong against the pressing force, but weak against the peeling force, and cause breakage or failure. By making the pressing force on the pre-sealing semiconductor device configuration 304 by the spring mechanism 864 larger than the peeling force generated by the pressure of the resin material 850S, it is possible to prevent that the active elements 155 and 157, etc. during resin molding are destroyed or broken.

As illustrated in FIG. 9(*a*), the resin material 850S, which has fluidity before curing, flows into the pre-sealing semiconductor device configuration 304 installed in the cavity of the mold 852, and thus the pressure applied to the resin material 850S is loaded onto the mold 852 and the pre-sealing semiconductor device configuration 304 as the hydrostatic pressure Ps.

As illustrated in FIG. 9(*b*), the hydrostatic pressure Ps generated by the resin material 850S deforms the connecting portion 810 of the fin base 800, and presses on the second surfaces 858 of the stepped portions 855a and 855b of the upper and lower molds 852a and 852b. At this time, the first elastically deformed portion 801, the second elastically deformed portion 802, the third elastically deformed portion 803, and the flat intermediate portion 804 are formed on the connecting portion 810.

As illustrated in FIG. 9(*b*), the connecting portion 810 of the fin base 800 is deformed by the first elastically deformed portion 801 so that the outer peripheral end 810a is located above the first surfaces 857 of the stepped portions 855a and 855b. The connecting portion 810 of the fin base 800 is also deformed by the second elastically deformed portion 802 and the third elastically deformed portion 803, and the intermediate portion 804 is deformed so as to be flat according to the surface of the second surface 858 of the mold 852. The connecting portion 810 of the fin base 800 is deformed by the second elastically deformed portion 802 on the root side so as to expand obliquely outward and toward the third elastically deformed portion 803.

When the injection pressure of the resin material 850S is 5 MPa, if the connecting portion 810 is made of an aluminum material of 0.6 mm or less, the connecting portion 810 having the first to third elastically deformed portions 801 to 803 and the intermediate portion 804 can be formed.

Normally, at a height position in the thickness direction of the connecting portion 810 of the upper and lower fin bases 800 of the pre-sealing semiconductor device configuration 304, in other words, the Z direction (hereinafter, may be simply referred to as "height position"), a variation of about 0.1 mm occurs in one pre-sealing semiconductor device configuration 304 itself due to component tolerances and variations during assembly. Further, a variation of about 0.2 mm occurs in the plurality of pre-sealing semiconductor device configurations 304.

On the other hand, in this embodiment, the intermediate portions 804 of the connecting portions 810 of the upper and lower fin bases 800 are pressed against the flat second surfaces 858 of the upper and lower molds 852a and 852b by the resin materials 850S at the time of molding. The connecting portion 810 is formed by elastic deformation so as to maintain this state. That is, even if the height positions of the intermediate portions 804 of the connecting portions 810 of the upper and lower fin bases 800 of the pre-sealing semiconductor device configuration 304 vary, the height positions of the intermediate portions 804 of all the connecting portions 810 of the pre-sealing semiconductor device configuration 304 can be set to the position of the second surfaces 858 of the upper and lower molds 852a and 852b. Therefore, the variation in height position of the intermediate portions 804 of the connecting portions 810 of the upper and lower fin bases 800 of the semiconductor device 300 can be extremely reduced. In the study by the present inventor, the variation in height position of the intermediate portions 804 of the connecting portions 810 of the upper and lower fin bases 800 could be made about 0.01 mm even among the plurality of semiconductor devices 300.

In the description of the elastic deformation of the connecting portion 810 of the fin base 800, it has been described regarding the X direction. However, as it is clear from FIG. 10, the connecting portion 810 of the fin base 800 is elastically deformed even in the Y direction similarly to the X direction.

Although not illustrated, the packaging of the first to fourth conductors 410 to 413, power terminals, and signal terminals is performed in a state where the first to fourth conductors 410 to 413, the power terminals, and the signal terminals are connected by a tie bar until the resin molding. After the resin molding, the tie bar is cut, and the power terminal and the signal terminal are processed into a predetermined shape, whereby the semiconductor device 300 illustrated in FIG. 1 can be obtained.

Figure 10:
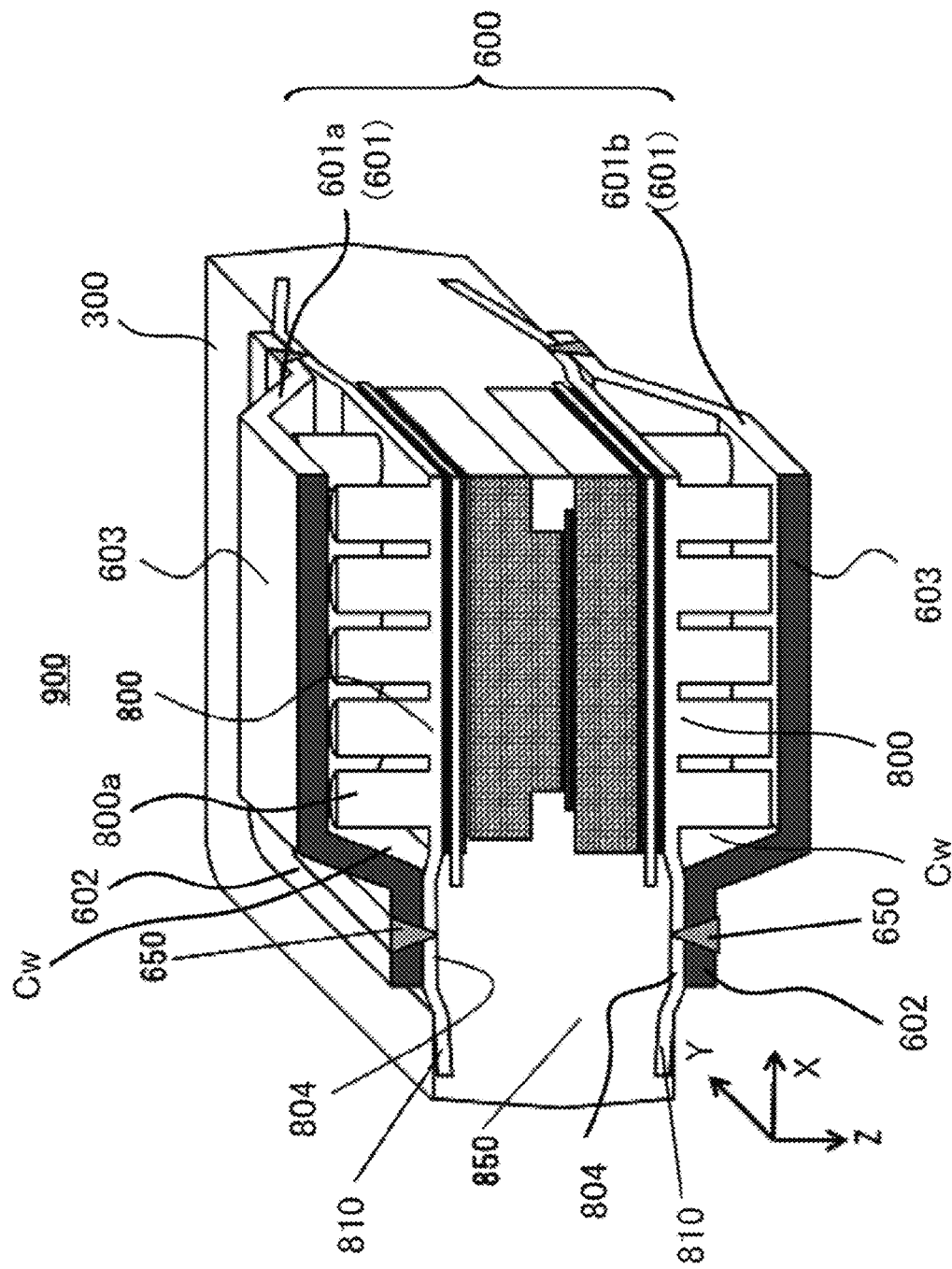
FIG. 10 is a cross-sectional view illustrating an example of a first embodiment of a semiconductor module according to the invention.

FIG. 10 is a cross-sectional view illustrating an example of the first embodiment of the semiconductor module according to the invention.

A semiconductor module 900 includes the semiconductor device 300 and the flow path forming body 600.

As described above, in the semiconductor device 300, the fin bases 800 are arranged above and below the first to fourth conductors 410 to 413, and the first to fourth conductors 410 to 413 are sealed by the resin 850 filled between the connecting portions 810 of the fin base 800. The connecting portion 810 has the intermediate portion 804 exposed on the upper and lower surfaces (Z direction) of the resin 850.

The flow path forming body 600 has an upper case 601a and a lower case 601b. The upper case 601a is bonded to the upper (−Z direction) fin base 800, and the lower case 601b is bonded to the lower (Z direction) fin base 800. The bonding structure between the upper case 601a and the fin base 800 and the bonding structure between the lower case 601b and the fin base 800 are the same. In the following, the upper case 601a and the lower case 601b are represented by the case 601 and the bonding structure between the case 601 and the fin base 800 will be described.

The case 601 has a base portion 602 having a rectangular frame shape in a plan view, and a cover portion 603 integrally formed with the base portion 602. The base portion 602 is formed in a flat shape substantially parallel to the XY plane, and is bonded to the intermediate portion 804 of the connecting portion 810 of the fin base 800. The cover portion 603 rises up from the base portion 602 to a height at which a gap is formed between the base portion 602 and the tip of the fin 800a of the fin base 800. The gap between the cover portion 603 and the fin 800a of the fin base 800 constitutes a cooling flow path Cw through which a refrigerant such as water flows.

The cooling flow path Cw between the upper case 601a and the lower case 601b is provided with a refrigerant inlet 13 (see FIG. 16) and a refrigerant outlet 14 (see FIG. 16) communicating with each other in a region (not illustrated).

The case 601a and the lower case 601b are assembled to form the flow path forming body 600.

The base portion 602 of the case 601 and the intermediate portion 804 of the connecting portion 810 of the fin base 800 are bonded by a bonding portion 650. The bonding portion 650 is formed over the entire circumference on the resin 850 that seals the outer peripheral side surfaces of the first to fourth conductors 410 to 413.

Adhesion or welding using resin can be used for bonding the base portion 602 of the case 601 and the connecting portion 810 of the fin base 800, but welding having excellent durability is preferable. Laser welding can be used as the bonding by welding. Generally, in laser welding, if a gap of 0.1 mm or more is generated between the members to be bonded, the risk of welding defects increases. As described above, in this embodiment, the variation in height position of the intermediate portions 804 of the connecting portions 810 of the upper and lower fin bases 800 could be made about 0.01 mm even among the plurality of semiconductor devices 300. Therefore, the reliability and workability of the bonding between the flow path forming body 600 and the fin base 800 can be improved, and thus the productivity can be improved.

Figure 11:
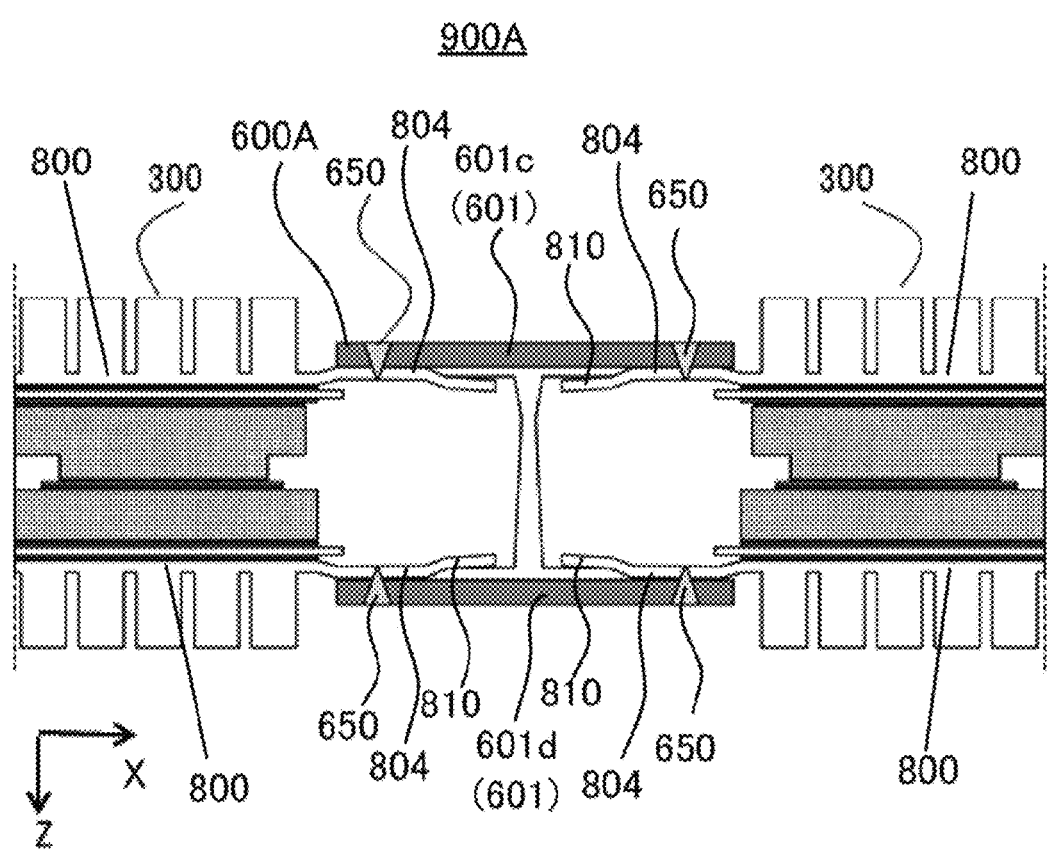
FIG. 11 is a cross-sectional view illustrating another example of the first embodiment of the semiconductor module according to the invention.

FIG. 11 is a cross-sectional view illustrating another example of the first embodiment of the semiconductor module according to the invention.

A semiconductor module 900A illustrated in FIG. 11 has two semiconductor devices 300 and one flow path forming body 600A. The flow path forming body 600A has an upper case 601c and a lower case 601d. The upper case 601c is bonded to the upper (−Z direction) fin base 800, and the lower case 601d is bonded to the lower (Z direction) fin base 800. The bonding structure between the upper case 601c and the fin base 800 and the bonding structure between the lower case 601d and the fin base 800 are the same. In the following, the upper case 601c and the lower case 601d are represented by the case 601 and the bonding structure between the case 601 and the fin base 800 will be described.

The case 601 has a frame-like shape, is arranged between the two semiconductor devices 300, and is bonded to both of the semiconductor devices 300. That is, the case 601 is bonded to the connecting portion 810 of the fin base 800 of one semiconductor device 300 at the bonding portion 650, and is bonded to the connecting portion 810 of the fin base 800 of the other semiconductor device 300 at the bonding portion 650.

The upper case 601c and the lower case 601d are provided with the refrigerant inlet 13 (see FIG. 16) and the refrigerant outlet 14 (see FIG. 16) communicating with each other in a region (not illustrated), and the upper case 601c and the lower case 601d are assembled to form the flow path forming body 600A.

Also in the embodiment illustrated in FIG. 11, in this embodiment, the variation in height position of the intermediate portions 804 of the connecting portions 810 of the upper and lower fin bases 800 of the semiconductor device 300 could be made about 0.01 mm even among the plurality of semiconductor devices 300. The upper case 601c and the lower case 601d are bonded to the intermediate portion 804 of the connecting portion 810 of the fin base 800 having such a small variation. Therefore, the flow path forming body 600A and the fin base 800 can be bonded well and efficiently in terms of strength and reliability.

In FIG. 11, the semiconductor module 900A is illustrated as a structure in which two semiconductor devices 300 are connected by one flow path forming body 600A. However, the number of semiconductor devices 300 may be three or more, and the adjacent semiconductor devices 300 may be connected by the flow path forming body 600A.

According to the first embodiment, the following effects are obtained.

(1) The semiconductor modules 900 and 900A include a semiconductor device 300 which includes a first fin base (heat dissipation member) 800 having a first connecting portion 810, a second fin base (heat dissipation member) 800 having a second connecting portion 810, and a resin 850 for sealing the outer peripheral side surfaces of the first to fourth conductors 410 to 413, and flow path forming bodies 600 and 600A which are connected to the first connecting portion 810 of the first fin base 800 and the second connecting portion 810 of the second fin base 800. The first elastically deformed portion 801, which is elastically deformed, is provided such that the gap in the thickness direction between the outer peripheral end 810a of the first connecting portion 810 of the first fin base 800 and the outer peripheral end 810a of the second connecting portion 810 of the second fin base 800 becomes smaller than the gap in the thickness direction between the intermediate portion 804 of the first connecting portion 810 of the first fin base 800 and the intermediate portion 804 of the second connecting portion 810 of the second fin base 800. The resin 850 is filled between the first connecting portion 810 of the first fin base 800 and the second connecting portion 810 of the second fin base 800. According to this configuration, the semiconductor modules 900 and 900A can be assembled only by connecting the flow path forming bodies 600 and 600A and the first and second fin bases 800 of the semiconductor device 300. Therefore, the procedure of aligning the end faces of the peripheral side portions of the upper and lower cases is not required, and the productivity of the semiconductor modules 900 and 900A can be improved.

Since the gap in the thickness direction between the outer peripheral ends 810a of the first and second fin bases 800 is elastically deformed to be smaller than the gap in the thickness direction between the intermediate portions 804, it is possible to prevent the resin material 850S from leaking to the outside from the first and second connecting portions 810 when molding.

(2) In the method for manufacturing the semiconductor module, the outer peripheral end 810a of each of the first connecting portion 810 of the first fin base 800 and the second connecting portion of the second fin base 800 is brought into contact with the step (abutting portion) 855 of the mold 852, the resin material 850S is filled between the first connecting portion 810 of the first fin base 800 and the second connecting portion 810 of the fin base 800, the first connecting portion 810 of the first fin base 800 and the second connecting portion 810 of the second fin base 800 each are elastically deformed such that the gap in the thickness direction between the intermediate portion 804 of the first connecting portion 810 of the first fin base 800 and the intermediate portion 804 of the second connecting portion 810 of the fin base 800 becomes larger than the gap in the thickness direction between the steps 855.

According to this method, the first and second connecting portions 810 of the first and second fin bases 800 are elastically deformed by the pressure at the time of injection of the resin material 850S. Therefore, it is not necessary to separately perform the procedure of elastically deforming the first and second connecting portions 810 of the first and second fin bases 800, and the productivity is improved.

In addition, the resin material 850S injected between the upper and lower fin bases 800 is suppressed from leaking at the abutting portion between the connecting portion 810 of the upper and lower fin bases 800 and the stepped portion 855*b* or the stepped portion 855*a*, and no leakage to the second surface 858 side of the step 855*b* or step 855*a* occurs.

Further, the connecting portion 810 of the upper and lower fin bases 800 is elastically deformed so as to be held at a position pressed against a lower surface 858 of the stepped portion 855 of the mold 852. That is, even if the gap between the connecting portions 810 of the upper and lower fin bases 800 of the pre-sealing semiconductor device configuration 304 varies, the Z-height positions of the intermediate portions 804 of all the connecting portions 810 of the pre-sealing semiconductor device configuration 304 can be set to the position of the lower surfaces 858 of the upper and lower molds 852*a* and 852*b*. Therefore, the variation in the gap between the intermediate portions 804 of the connecting portions 810 of the upper and lower fin bases 800 can be extremely reduced. As a result, the reliability and workability of bonding the upper and lower fin bases 800 and the flow path forming bodies 600 and 600A can be improved, and thus the productivity can be improved.

Figure 12:
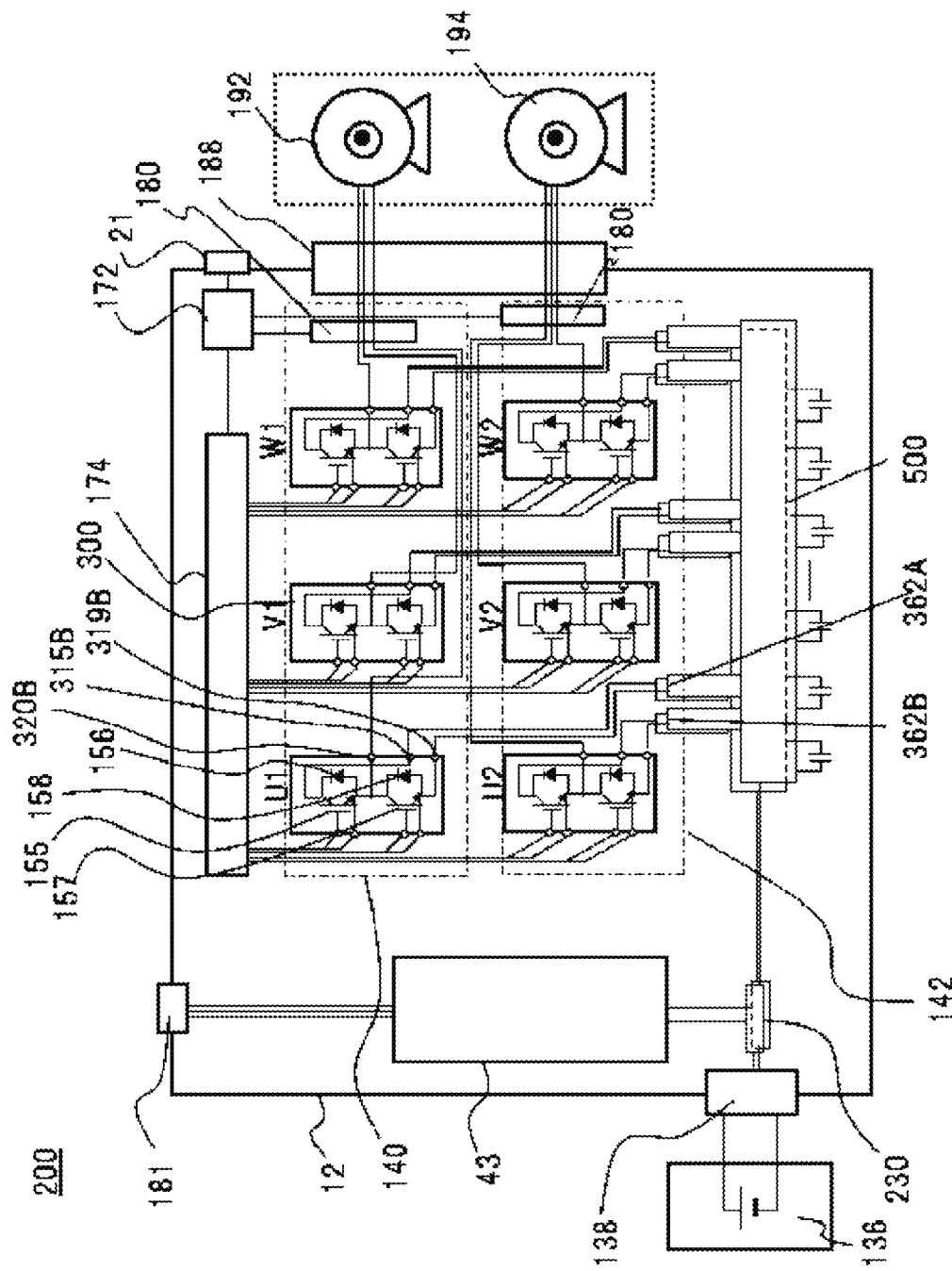
FIG. 12 is a circuit diagram of a power conversion device using a semiconductor module according to the invention.

FIG. 12 is a circuit diagram of a power conversion device using the semiconductor module according to the invention.

A power conversion device 200 includes inverter circuit units 140 and 142, an inverter circuit unit 43 for auxiliary equipment, and a capacitor module 500. The inverter circuit units 140 and 142 include a plurality of power semiconductor devices 300, and form a three-phase bridge circuit by connecting them. When a current capacity is large, the semiconductor devices 300 are further connected in parallel, and these parallel connections are made for each phase of the three-phase inverter circuit, so that the current capacity can be increased. Further, the increase in current capacity can be coped with by connecting the active elements 155 and 157 and the diodes 156 and 158, which are power semiconductor elements built in the semiconductor device 300, in parallel.

The inverter circuit unit 140 and the inverter circuit unit 142 have the same basic circuit configuration, and the control method and operation are basically the same. Since the outline of the circuit operation of the inverter circuit unit 140 and the like is well known, detailed description is omitted here.

As described above, the upper arm circuit includes an active element 155 for the upper arm and a diode 156 for the upper arm as a power semiconductor element for switching. The lower arm circuit includes an active element 157 for the lower arm and a diode 158 for the lower arm as a power semiconductor element for switching. The active elements 155 and 157 receive a drive signal output from one or the other of the two driver circuits constituting a driver circuit 174, perform a switching operation, and convert DC power supplied from a battery 136 into three-phase AC power.

As described above, the active element 155 for the upper arm and the active element 157 for the lower arm include a collector electrode, an emitter electrode, and a gate electrode. The diode 156 for the upper arm and the diode 158 for the lower arm include two electrodes, a cathode electrode and an anode electrode. As illustrated in FIG. 3, the cathode electrodes of the diodes 156 and 158 are electrically connected to the collector electrodes of the IGBTs 155 and 157, and the anode electrodes are electrically connected to the emitter electrodes of the active elements 155 and 157, respectively. As a result, the current flow from the emitter electrode of the active element 155 for the upper arm and the active element 157 for the lower arm to the collector electrode is in the forward direction.

Further, a MOSFET (metal oxide semiconductor field effect transistor) may be used as the active element. In this case, the diode 156 for the upper arm and the diode 158 for the lower arm become unnecessary.

The positive electrode side terminal 315B and the negative electrode side terminal 319B of each upper/lower arm series circuit are connected to the DC terminals for connecting the capacitors of the capacitor module 500, respectively. AC power is generated at each connecting portion between the upper arm circuit and the lower arm circuit, and the connecting portion between the upper arm circuit and the lower arm circuit of each upper/lower arm series circuit is connected to the AC side terminal 320B of each semiconductor device 300. The AC side terminal 320B of each semiconductor device 300 of each phase is connected to the AC output terminal of the power conversion device 200, and the generated AC power is supplied to the stator winding of a motor generator 192 or 194.

A control circuit 172 generates a timing signal for controlling a switching timing of the active element 155 for the upper arm and the active element 157 for the lower arm based on input information from a control device or a sensor (for example, the current sensor 180) on the vehicle side. The driver circuit 174 generates a drive signal for switching the active element 155 for the upper arm and the active element 157 for the lower arm based on the timing signal output from the control circuit 172.

Note that 181, 182, and 188 are connectors.

The upper/lower arm series circuit includes a temperature sensor (not illustrated), and the temperature information of the upper/lower arm series circuit is input to a microcomputer. Further, voltage information on the DC positive electrode side of the upper/lower arm series circuit is input to the microcomputer. The microcomputer performs over-temperature detection and over-voltage detection based on the information. If over-temperature or over-voltage is detected, the microcomputer stops the switching operations of all active elements 155 for the upper arm and active elements 157 for the lower arm, and protects the upper/lower arm series circuit from over-temperature or over-voltage.

Figure 13:
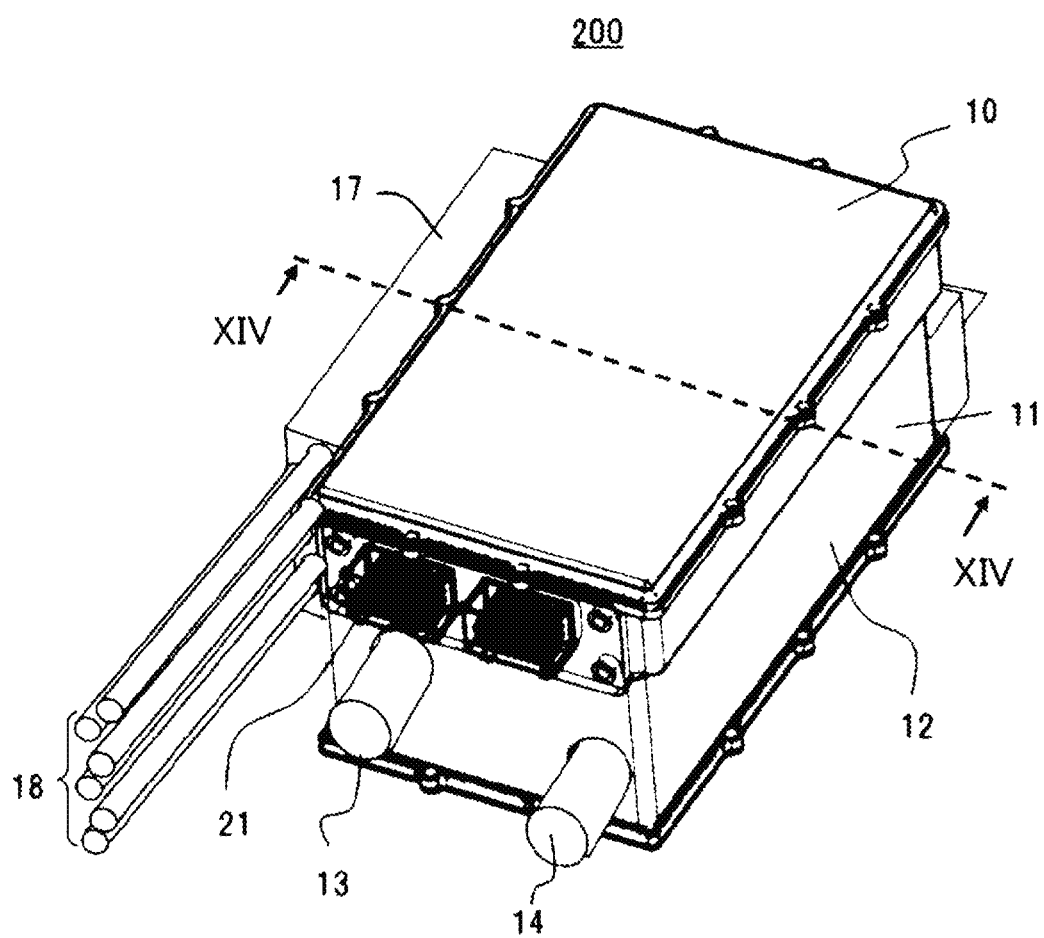
FIG. 13 is an external perspective view illustrating the example of the power conversion device illustrated in FIG. 12.
Figure 14:
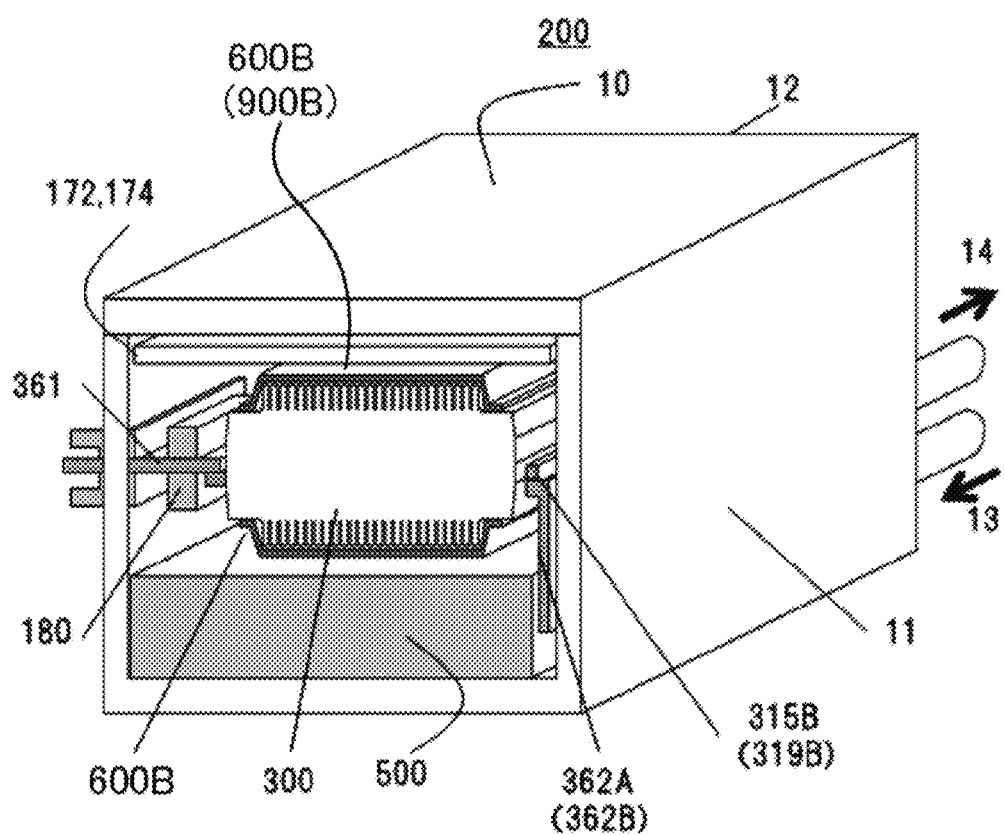
FIG. 14 is a cross-sectional view taken along line XIV-XIV of the power conversion device illustrated in FIG. 13.
Figure 15:
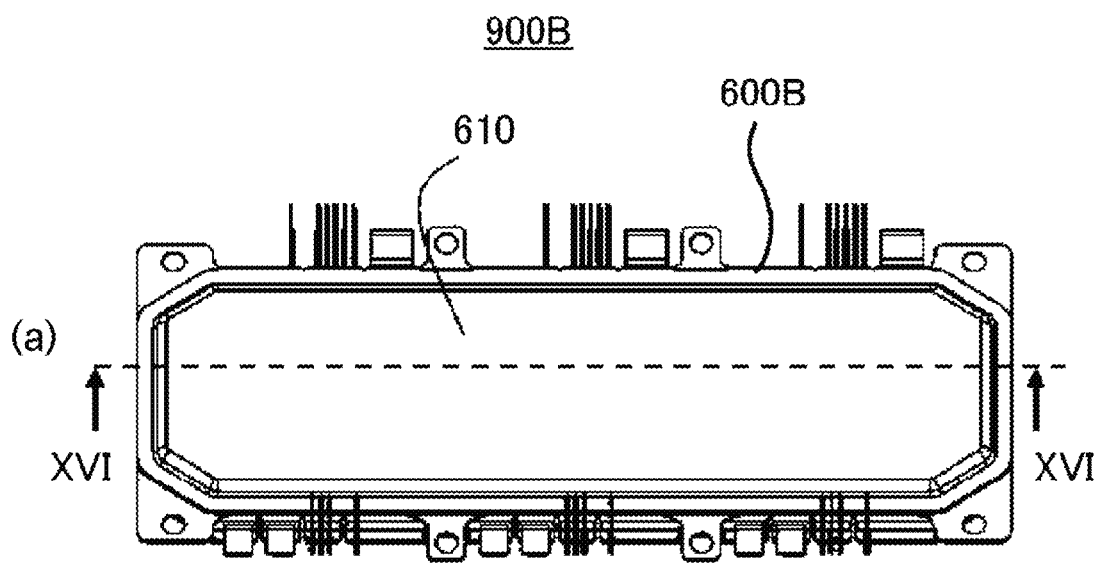
FIG. 15(a) is a perspective view of the power conversion device illustrated in FIG. 14 as viewed from above.
FIG. 15(b) is a perspective view of the power conversion device illustrated in FIG. 14 as viewed from below.
Figure 15:
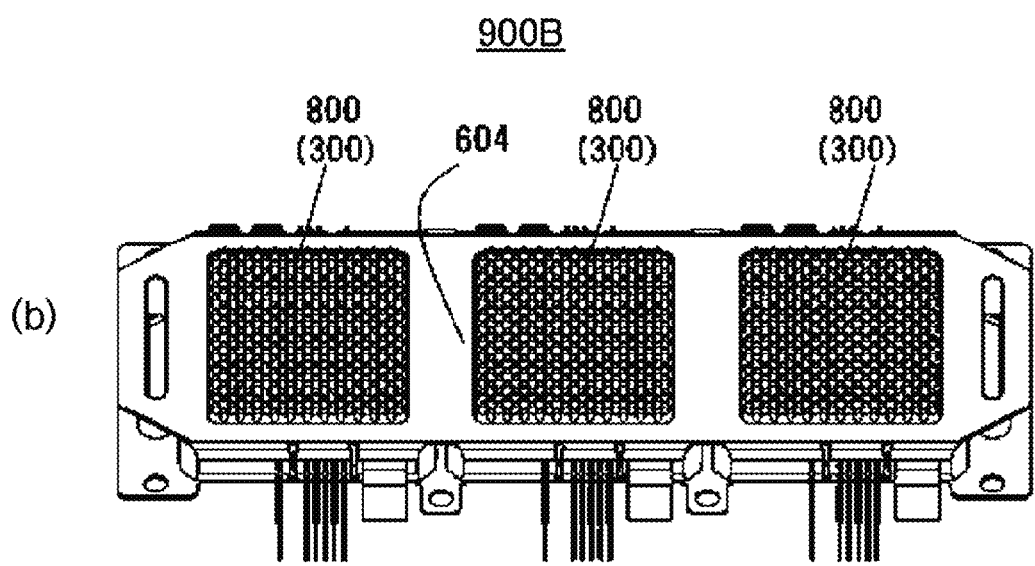
Figure 16:
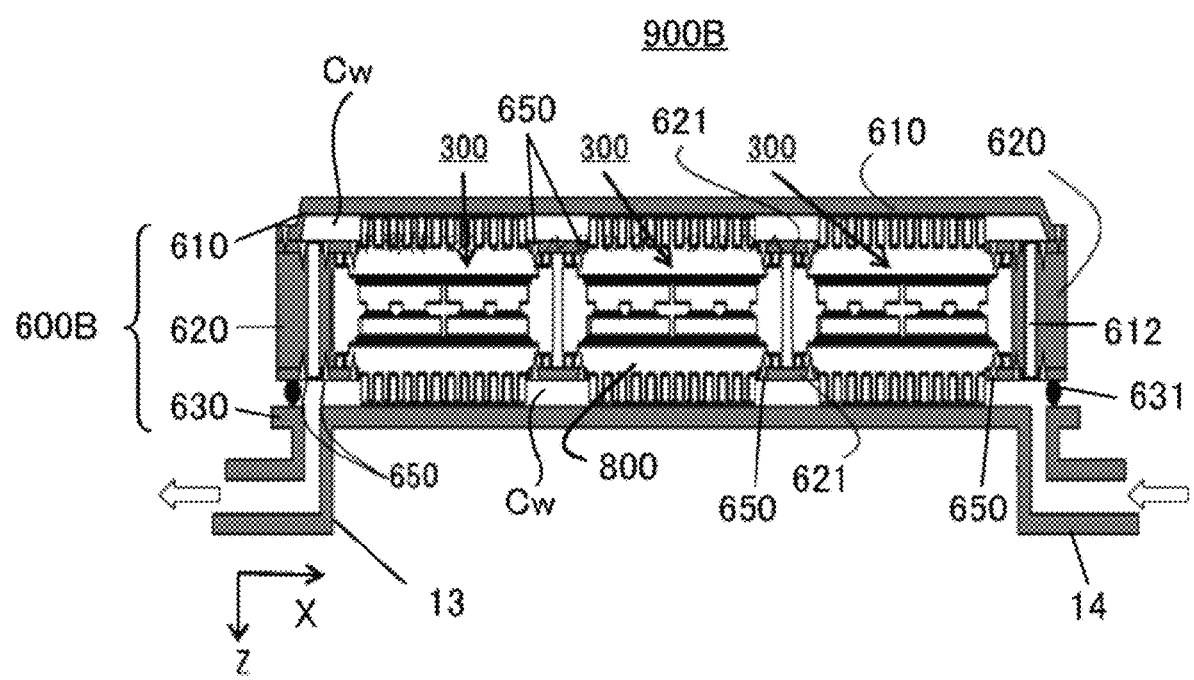
FIG. 16 is a cross-sectional view taken along line XVI-XVI of FIG. 15(a).

FIG. 13 is an external perspective view illustrating an example of the power conversion device illustrated in FIG. 12, and FIG. 14 is a cross-sectional view taken along line XIV-XIV of the power conversion device illustrated in FIG. 13. FIG. 15(*a*) is a perspective view of the power conversion device illustrated in FIG. 14 as viewed from above, and FIG. 15(*b*) is a perspective view of the power conversion device illustrated in FIG. 14 as viewed from below, and FIG. 16 is a cross-sectional view taken along line XVI-XVI of FIG. 15(*a*).

The power conversion device 200 is composed of a lower case 11 and an upper case 10, and includes a housing 12 formed in a substantially rectangular parallelepiped shape. A semiconductor module 900B, the capacitor module 500, and the like illustrated in FIG. 15 are housed inside the housing 12. The semiconductor module 900B includes a flow path forming body 600B. A refrigerant inflow pipe 13 and a refrigerant outflow pipe 14, communicating with the cooling flow path Cw (see FIG. 10) of the flow path forming body 600B, protrude from one side surface of the housing 12. As illustrated in FIG. 14, the lower case 11 has an opening on the upper side, and the upper case 10 is attached to the lower case 11 by closing the opening of the lower case 11. The upper case 10 and the lower case 11 are formed of an aluminum alloy or the like, and are sealed against the outside and fixed. The upper case 10 and the lower case 11 may be integrated. Since the housing 12 has a simple rectangular parallelepiped shape, it can be easily attached to a vehicle or the like and can be easily produced.

As illustrated in FIG. 13, a connector 17 is attached to one side surface of the housing 12 in the longitudinal direction, and an AC terminal 18 is connected to the connector 17. Further, a connector 21 is provided on the surface from which the refrigerant inflow pipe 13 and the refrigerant outflow pipe 14 are led out.

As illustrated in FIG. 14, the semiconductor module 900B is housed in the housing 12. The control circuit 172 and the driver circuit 174 are arranged on the upper side of the semiconductor module 900B, and a capacitor module 500 is housed on the lower side of the semiconductor module 900. As illustrated in FIGS. 15(a) and 15(b), the semiconductor module 900B has a 6in1 structure having three semiconductor devices 300 having a 2in1 structure. That is, one of the inverter circuit units 140 and 142 illustrated in FIG. 12 is included. In addition, in FIG. 15(b), in order to illustrate the arrangement of the semiconductor device 300, the fin base 800 is illustrated through the flow path forming body 600.

The AC side terminal 320B of the semiconductor device 300 penetrates the current sensor 180 and is bonded to a bus bar 361. Further, the positive electrode side terminal 315B and the negative electrode side terminal 319B, which are DC terminals of the semiconductor device 300, are bonded to positive and negative electrode terminals 362A and 362B of the capacitor module 500, respectively.

In the semiconductor device 300 illustrated in FIG. 14, the AC side terminal 320B is not bent and extends straight. Further, the positive electrode side terminal 315B and the negative electrode side terminal 319B have a short shape cut on the root side.

The power conversion device 200 is manufactured to accommodate the capacitor module 500 in the lower case 11, accommodate the semiconductor module 900B manufactured in advance on the capacitor module 500, and accommodate the control circuit 172 and the driver circuit 174 on the semiconductor module 900B. When accommodating the semiconductor module 900B, the AC side terminal 320B of each semiconductor device 300 is bonded to the bus bar 361, and the positive electrode side terminal 315B and the negative electrode side terminal 319B are bonded to the positive and negative electrode terminals 362A and 362B of the capacitor module 500, respectively. When accommodating the control circuit 172 and the driver circuit 174, the signal terminal of each semiconductor device 300 and the connection terminals (not illustrated) of the control circuit 172 and the driver circuit 174 are connected. The power conversion device 200 illustrated in FIG. 13 can be obtained by accommodating the semiconductor module 900B, the capacitor module 500, the control circuit 172, and the driver circuit 174 in the lower case 11 and then sealing them with the upper case 10.

As illustrated in FIGS. 15(a), 15(b), and 16, the semiconductor module 900B has an elongated rectangular parallelepiped shape. The flow path forming body 600B of the semiconductor module 900 is formed of iron, an aluminum alloy, or the like.

As illustrated in FIG. 16, the flow path forming body 600B has a structure in which the flow path forming body 600 illustrated in FIG. 10 and the flow path forming body 600A illustrated in FIG. 11 are combined, and has a flow path upper cover 610, a flow path housing 620, and a flow path lower cover 630. The flow path housing 620 is provided with a frame 621 for connecting adjacent semiconductor devices 300 to each other. The flow path upper cover 610 and the flow path housing 620 are assembled by a fastening member (not illustrated). The flow path housing 620 and the flow path lower cover 630 are connected via an O-ring 631 to form a watertight structure.

As illustrated in FIG. 11, the frame 621 is connected by a bonding portion 650 of the connecting portion 810 of the fin base 800 of each adjacent semiconductor device 300, and connects the semiconductor devices 300 on both sides.

The flow path lower cover 630 is provided with the refrigerant inflow pipe 13 and the refrigerant outflow pipe 14. The flow path housing 620 is formed with a flow through path 612 that penetrates the frame 621 in the thickness (Z direction). The refrigerant flowing in from the refrigerant inflow pipe 13 flows through the flow path provided between the lower surface (Z direction) of each semiconductor device 300 and the flow path lower cover 630 to cool down each semiconductor device 300 from the lower side. Further, the refrigerant flowing in from the refrigerant inflow pipe 13 flows through the flow path provided between the upper surface (−Z direction) of each semiconductor device 300 and the flow path upper cover 610 via the flow through path 612 to cool down each semiconductor device 300 from above. The refrigerant that cools each semiconductor device 300 from the upper side and the lower side flows out from the refrigerant outflow pipe 14. The cooling flow path Cw for cooling each semiconductor device 300 is formed in the flow path lower cover 630, the flow path housing 620, and the flow path upper cover 610.

In this way, the power conversion device 200 having a 6in1 structure is formed by using three semiconductor devices 300 having a 2in1 structure.

Second Embodiment

Figure 17:
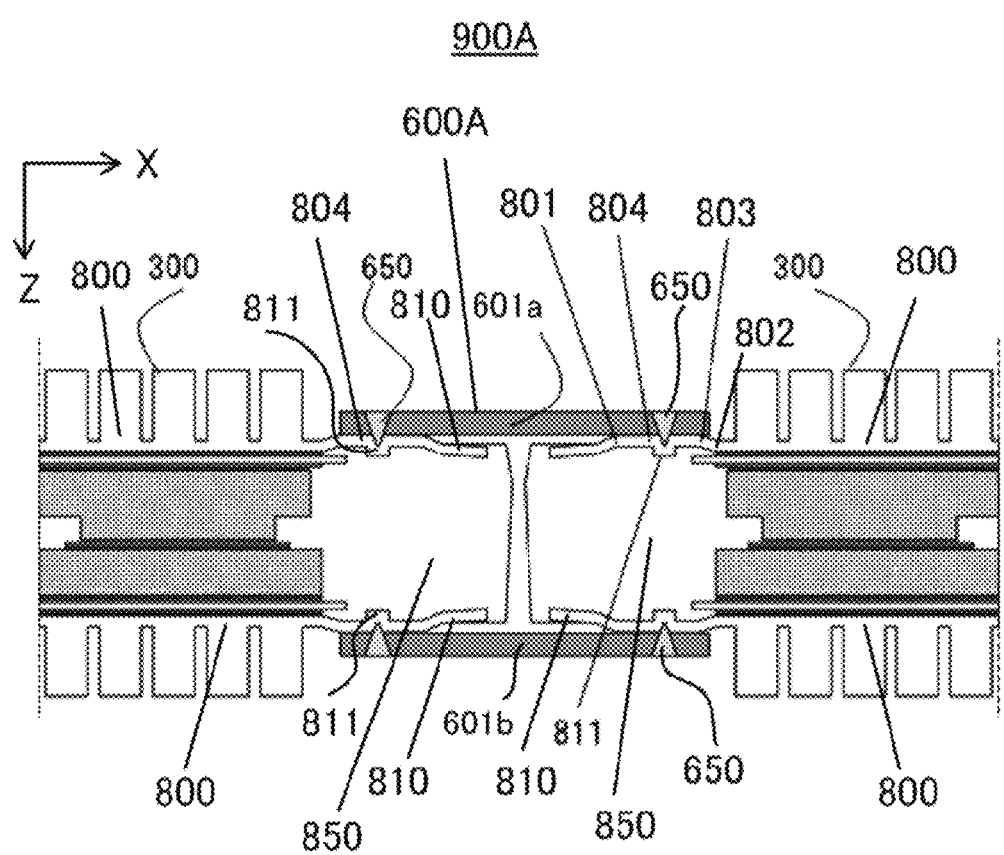
FIG. 17 is a cross-sectional view illustrating a second embodiment of the semiconductor module according to the invention.

FIG. 17 is a cross-sectional view illustrating a second embodiment of the semiconductor module according to the invention.

In the second embodiment, a thick portion 811 is provided in the intermediate portion 804 of the connecting portion 810 of the fin base 800 of the semiconductor device 300.

The thick portion 811 is provided so as to project to the side opposite to the flow path forming body 600A side of the connecting portion 810. Since the thick portion 811 is provided in the intermediate portion 804 between the first elastically deformed portion 801 and the third elastically deformed portion 803, the connecting portion 810 can be elastically deformed by the first to third elastically deformed portions 801 to 803 without inhibiting the elastic deformation of the connecting portion 810. When the connecting portion 810 of the fin base 800 and the flow path forming body 600A are bonded by laser welding, the laser may penetrate the connecting portion 810 of the fin base 800 and the flow path forming body 600A in the thickness direction due to the variation in the laser output. By providing the thick portion 811 in the connecting portion 810 of the fin base 800, it is possible to suppress such penetration of the laser and secure the bonding strength.

Other configurations in the second embodiment are similar to those in the first embodiment.

Therefore, the second embodiment has the same effect as that of the first embodiment.

Third Embodiment

Figure 18:
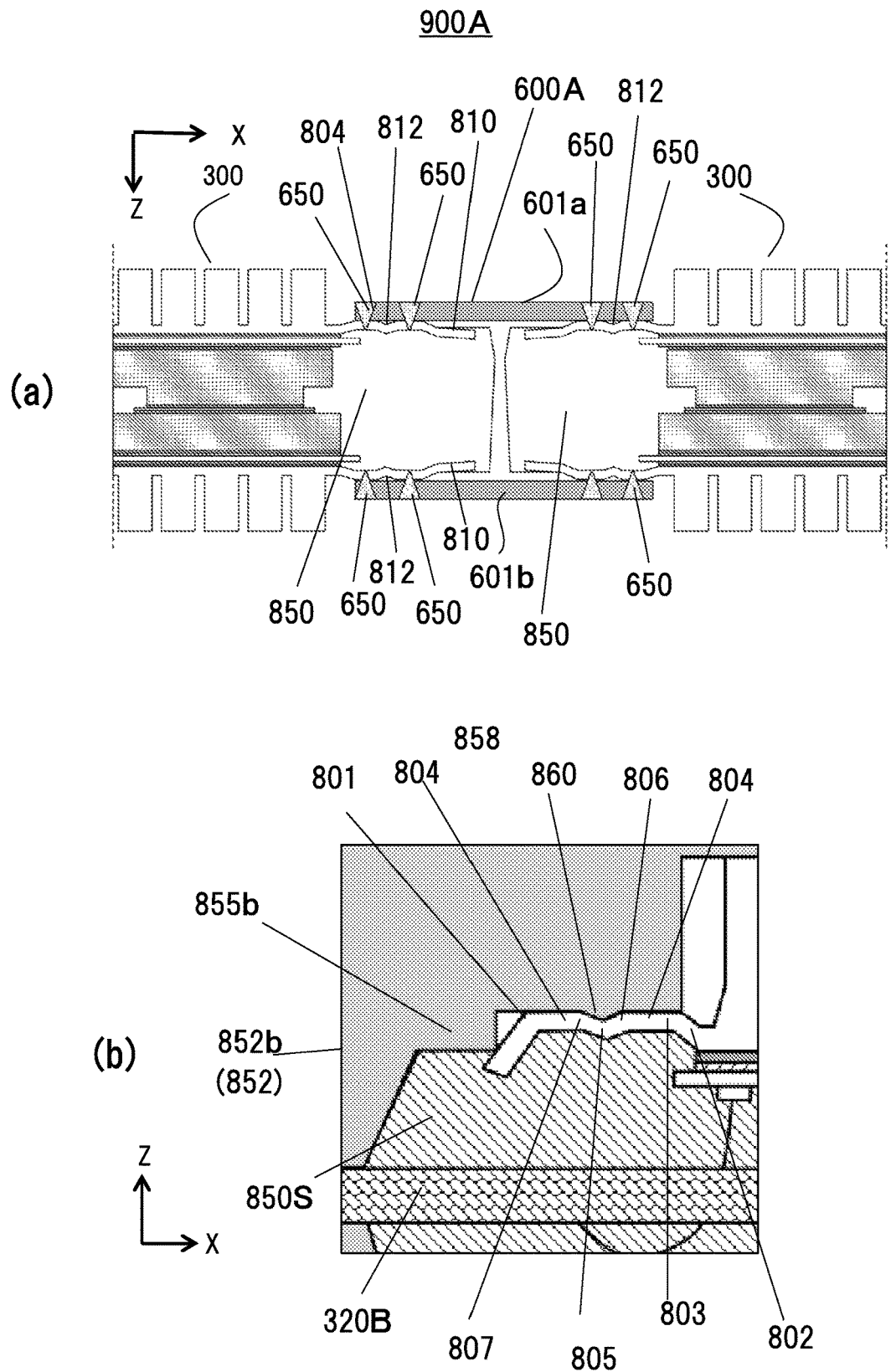
FIG. 18(a) is a cross-sectional view of a third embodiment of the semiconductor module according to the invention.
FIG. 18(b) is an enlarged cross-sectional view of a process of molding the connecting portion of the fin base illustrated in FIG. 18 (a).

FIG. 18(a) is a cross-sectional view of a third embodiment of the semiconductor module according to the invention, and FIG. 18(b) is an enlarged cross-sectional view of a process of molding the connecting portion of the fin base illustrated in FIG. 18(a).

In the third embodiment, the semiconductor device 300 has a structure in which a recess 812 having a triangular cross section is provided in the intermediate portion 804 of the connecting portion 810 of the fin base 800. The recess 812 is provided in an annular shape over the entire circumference at substantially the center of the width (length in the X direction) of the intermediate portion 804 of the connecting portion 810, and the connecting portion 810 is divided into two flat portions extending in the X direction and the −X direction with the recess 812 as a boundary.

The mold 852 is provided with a protrusion 860 having a triangular cross section for forming the recess 812 in an annular shape over the entire circumference.

When the resin material 850S is injected into the mold 852, the resin material 850S is filled between the connecting portions 810 of the upper and lower fin bases 800, and the connecting portion 810 of each fin base 800 is pressed to the second surface 858 of the stepped portion 855b by the resin pressure. Since the mold 852 is formed with the protrusion 860, the connecting portion 810 is formed with elastically deformed portions 805, 806, and 807 at the top and the root portions on both sides of the top, which are the corners of the protrusion 860, respectively, and this state is maintained.

As illustrated in FIG. 18(a), the upper and lower cases 601 of the flow path forming body 600A are respectively bonded to the connecting portion 810 of the fin base 800 of each semiconductor device 300 by two bonding portions 650. The two bonding portions 650 are provided one by one in the area of the flat portion in the X direction and the region of the flat portion in the −X direction of the recess 812 of the connecting portion 810.

In this way, the connecting portion 810 of one fin base 800 is bonded to each case 601 of the flow path forming body 600 at two places to ensure the reliability of the connection strength and to improve watertight performance.

The other configurations in the third embodiment are the same as those in the first embodiment.

Therefore, the third embodiment has the same effect as that of the first embodiment.

In the above embodiment, the semiconductor modules 900 and 900A are exemplified as a 2in1 structure in which a pair of upper arms and a lower circuit is provided or a 6in1 structure in which three pairs are provided. However, the semiconductor modules 900 and 900A can also have a 3in1 structure or a 4in1 structure.

The 3in1 structure has, for example, a structure in which three upper arm circuits are packaged, or a structure in which three lower arm circuits are packaged. A semiconductor module having a 6in1 structure can be formed by combining an upper arm package in which three upper arm circuits are packaged and a lower arm package in which three lower arm circuits are packaged.

In the above embodiment, the structure has been exemplified in which the first to fourth conductors 410 to 413 and the wirings 452 and 454 of the wiring boards 422 and 423 are bonded, and the wirings 452 and 454 of the wiring boards 422 and 423 and the fin base 800 are bonded by the metal bonding member 51. However, instead of bonding with the metal bonding member 51, other bonding methods such as conductive adhesive, welding, and melt bonding by ion beam irradiation may be used.

Various embodiments and modifications have been described, but the invention is not limited to these contents. The various embodiments described above and modifications may be combined, or changes may be added as appropriate, and other aspects considered within the scope of the technical idea of the invention are also included within the scope of the invention.

REFERENCE SIGNS LIST 155, 157 active element (semiconductor element)
156, 158 diode (semiconductor element)
200 power conversion device
300 semiconductor device
304 pre-sealing semiconductor device configuration
410 to 413 first to fourth conductors
422 emitter-side wiring board
423 collector-side wiring board
451, 453 insulating plate
600, 600A, 600B flow path forming body
601 case (frame)
601a, 601c upper case (frame)
601b, 601d lower case (frame)
602 base portion (frame)
603 cover portion
621 frame
650 bonding portion
800 fin base (heat dissipation member)
800a fin
801 to 803 first to third elastically deformed portions
804 intermediate portion (flat portion)
810 connecting portion
810a outer peripheral end
811 thick portion
812 recess
850 resin
850S resin material
852 mold
855, 855a, 855b stepped portion (abutting portion)
900, 900A semiconductor module
900A semiconductor module
Cw cooling flow path
Ps hydrostatic pressure

The invention claimed is:
1. A semiconductor module, comprising:
a semiconductor device that includes
a semiconductor element,
a pair of conductors that is arranged so as to sandwich the semiconductor element and face each other in a thickness direction, and connected to the semiconductor element, respectively,
a first heat dissipation member that is arranged on a surface of a side opposite to the semiconductor element of one conductor of the pair of conductors via an insulating member, and includes a first connecting portion extending outward from an outer peripheral side surface of the one conductor,
a second heat dissipation member that is arranged on a surface of a side opposite to the semiconductor element of the other conductor of the pair of conductors via an insulating member, and includes a second connecting portion extending outward from an outer peripheral side surface of the other conductor, and
a resin for sealing the outer peripheral side surfaces of the pair of conductors; and
a flow path forming body that is connected to the first connecting portion of the first heat dissipation member and the second connecting portion of the second heat dissipation member of the semiconductor device,
wherein a first elastically deformed portion which is elastically deformed is provided such that a distance in a thickness direction between an outer peripheral end of the first connecting portion of the first heat dissipation member and an outer peripheral end of the second connecting portion of the second heat dissipation member becomes smaller than a distance in a thickness direction between an intermediate portion of the first connecting portion of the first heat dissipation member and an intermediate portion of the second connecting portion of the second heat dissipation member, and wherein the resin is filled between the first connecting portion of the first heat dissipation member and the second connecting portion of the second heat dissipation member.

2. The semiconductor module according to claim 1, wherein the first heat dissipation member and the second heat dissipation member include fins for heat dissipation, respectively.

3. The semiconductor module according to claim 1, wherein each of the first connecting portion of the first heat dissipation member and the second connecting portion of the second heat dissipation member includes a flat portion between a root portion facing the outer peripheral side surface of the conductor and the outer peripheral end.

4. The semiconductor module according to claim 3, wherein the root portion of each of the first connecting portion of the first heat dissipation member and the second connecting portion of the second heat dissipation member includes a second elastically deformed portion which is elastically deformed such that a distance in a thickness direction becomes larger toward the flat portion side.

5. The semiconductor module according to claim 3, wherein the flow path forming body is bonded to each of the first connecting portion and the second connecting portion in the flat portion of each of the first connecting portion of the first heat dissipation member and the second connecting portion of the second heat dissipation member.

6. The semiconductor module according to claim 5, wherein the flow path forming body is bonded to the first connecting portion of the first heat dissipation member and the second connecting portion of the second heat dissipation member by welding.

7. The semiconductor module according to claim 1, wherein the flow path forming body includes a cover portion that is provided to cover a surface on a side opposite to the conductor of each of the first heat dissipation member and the second heat dissipation member, and forms a flow path for a refrigerant between the conductor of each of the first heat dissipation member and the second heat dissipation member and the opposite surface.

8. The semiconductor module according to claim 1, comprising:

a plurality of the semiconductor devices, wherein the flow path forming body includes a frame that connects the first connecting portions of the first heat dissipation members of the adjacent semiconductor devices to each other and the second connecting portions of the second heat dissipation members of the semiconductor devices to each other.

9. A power conversion device that accommodates a plurality of the semiconductor modules according to claim 1 in the flow path forming body.

10. A manufacturing method of the semiconductor module according to claim 1, comprising:

bringing the outer peripheral end of each of the first connecting portion of the first heat dissipation member and the second connecting portion of the second heat dissipation member into contact with an abutting portion of a mold;

filling the resin between the first connecting portion of the first heat dissipation member and the second connecting portion of the second heat dissipation member; and elastically deforming each of the first connecting portion of the first heat dissipation member and the second connecting portion of the second heat dissipation member such that a distance in a thickness direction between an intermediate portion of the first connecting portion of the first heat dissipation member and an intermediate portion of the second connecting portion of the second heat dissipation member becomes larger than a distance in a thickness direction between the abutting portions.

\* \* \* \* \*